(12) United States Patent
Peterson et al.

(10) Patent No.: US 11,474,941 B2
(45) Date of Patent: Oct. 18, 2022

(54) USING MULTI-TIERED CACHE TO SATISFY INPUT/OUTPUT REQUESTS

(71) Applicant: International Business Machines Corporation, Armonk, NY (US)

(72) Inventors: Beth Ann Peterson, Tucson, AZ (US); Kevin J. Ash, Tucson, AZ (US); Lokesh Mohan Gupta, Tucson, AZ (US); Warren Keith Stanley, Loveland, CO (US); Roger G. Hathorn, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 16/813,507

(22) Filed: Mar. 9, 2020

(65) Prior Publication Data
US 2021/0279174 A1    Sep. 9, 2021

(51) Int. Cl.
*G06F 12/08*        (2016.01)
*G06F 12/0811*   (2016.01)
(Continued)

(52) U.S. Cl.
CPC .......... *G06F 12/0811* (2013.01); *G06F 9/505* (2013.01); *G06F 11/3037* (2013.01);
(Continued)

(58) Field of Classification Search
CPC ............. G06F 12/0811; G06F 12/0866; G06F 12/0891
(Continued)

(56) References Cited

U.S. PATENT DOCUMENTS

| 9,235,531 B2 | 1/2016 | Celis et al. |
| 9,495,116 B2 | 11/2016 | Marcu et al. |

(Continued)

FOREIGN PATENT DOCUMENTS

| CN | 104699626 A | 6/2015 |
| CN | 106055274 A | 10/2016 |
| WO | 2011146499 A1 | 11/2011 |

OTHER PUBLICATIONS

International Preliminary Examination Report from PCT Application No. PCT/IB2021/051379, dated May 26, 2021.
Peterson et al., U.S. Appl. No. 17/857,946, filed Jul. 5, 2022.

*Primary Examiner* — Than Nguyen
(74) *Attorney, Agent, or Firm* — Zilka-Kotab, P.C.

(57) ABSTRACT

A computer-implemented method, according to one approach, includes: receiving a stream of incoming I/O requests, all of which are satisfied using one or more buffers in a primary cache. However, in response to determining that the available capacity of the one or more buffers in the primary cache is outside a predetermined range: one or more buffers in the secondary cache are allocated. These one or more buffers in the secondary cache are used to satisfy at least some of the incoming I/O requests, while the one or more buffers in the primary cache are used to satisfy a remainder of the incoming I/O requests. Moreover, in response to determining that the available capacity of the one or more buffers in the primary cache is not outside the predetermined range: the one or more buffers in the primary cache are again used to satisfy all of the incoming I/O requests.

24 Claims, 15 Drawing Sheets

(51) Int. Cl.
*G06F 12/0891* (2016.01)
*G06F 12/0866* (2016.01)
*G06F 12/0897* (2016.01)
*G06F 9/50* (2006.01)
*G11C 11/406* (2006.01)
*G06F 11/30* (2006.01)

(52) U.S. Cl.
CPC ...... *G06F 12/0866* (2013.01); *G06F 12/0891* (2013.01); *G06F 12/0897* (2013.01); *G11C 11/406* (2013.01); *G06F 2201/885* (2013.01); *G06F 2209/5019* (2013.01)

(58) Field of Classification Search
USPC ........................................................ 711/122
See application file for complete search history.

(56) References Cited

U.S. PATENT DOCUMENTS

| | | | |
|---|---|---|---|
| 10,102,126 | B2 | 10/2018 | Ramanujan et al. |
| 10,241,710 | B2 | 3/2019 | Fanning et al. |
| 2014/0101370 | A1 | 4/2014 | Chu et al. |
| 2015/0370715 | A1* | 12/2015 | Samanta ............ G06F 11/0793 711/135 |
| 2016/0259586 | A1 | 9/2016 | Tylik et al. |
| 2016/0378656 | A1* | 12/2016 | Kudo ................. G06F 12/0815 711/143 |
| 2020/0026647 | A1* | 1/2020 | Li ....................... G06F 12/0804 |

\* cited by examiner

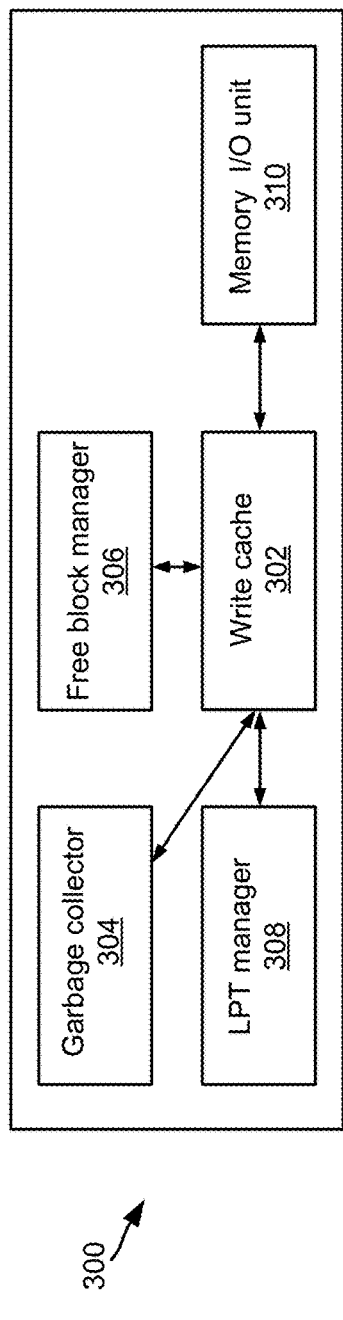
FIG. 3
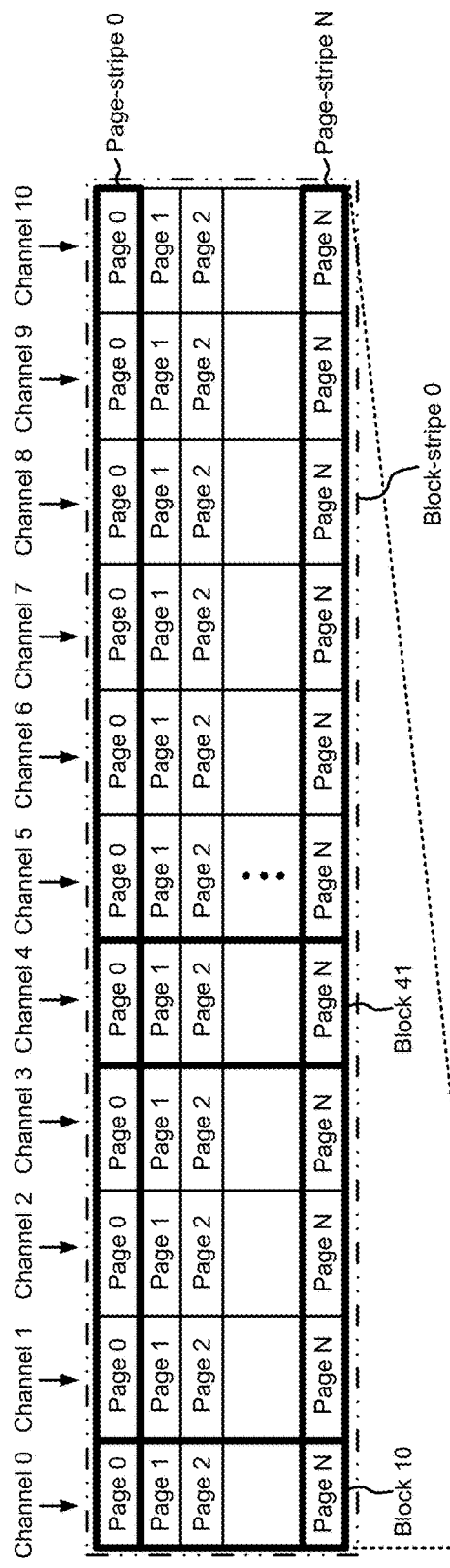
FIG. 4
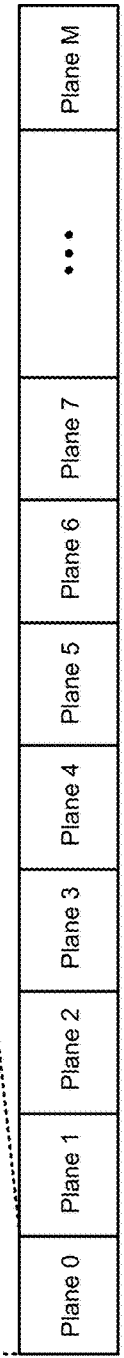

USING MULTI-TIERED CACHE TO SATISFY INPUT/OUTPUT REQUESTS

BACKGROUND

The present invention relates to data storage systems, and more particularly, this invention relates to using multi-tiered cache having different respective performance levels to satisfy input/output (I/O) requests.

Random access memory (RAM) is a type of memory which operates in a fundamentally unique manner compared to traditional sequential access memory. For example, the performance characteristics of NAND Flash-based solid state drives (SSDs) are different from those of sequential hard disk drives (HDDs). Data in conventional SSDs is typically organized in pages of 4, 8, or 16 KB sizes. Moreover, page read operations in SSDs are typically one order of magnitude faster than write operations and latency depends on neither the current, nor the previous, location of operations.

However, in RAM, memory locations are erased in blocks prior to being written to. Specifically, due to the limitations of current NAND memory technology, an invalidated data location cannot be reused until the entire block it belongs to has been erased. Before erasing, though, the block undergoes garbage collection, whereby any valid data in the block is relocated to a new block. Garbage collection of a block is typically deferred for as long as possible to maximize the amount of invalidated data in the block, and thus reduce the number of valid pages that are relocated, as relocating data causes additional write operations, and thereby increases write amplification.

While RAM is able to achieve faster read and write performance in comparison to sequential access memory, the physical cells that store bits of information therein can only be written to a finite number of times before they begin to wear out. For instance, the raw bit error rate (RBER) of a memory block in RAM will typically increase over time due to additional program/erase (P/E) cycling, charge leakage over time (i.e., data retention), and additional charge placed in the cells by read or program operations (i.e., read or program disturb errors, respectively). Typically, a memory block in RAM is retired when any page in the block exhibits a code word that reaches a page retirement error count limit.

RAM also has a higher cost associated therewith in comparison to sequential access memory. As a result, storage capacity in RAM implementations is typically limited and operations involving larger amounts of data create performance bottlenecks. Similarly, data that has been recalled to RAM to perform an operation may not be used again for a substantial amount of time, thereby polluting the RAM by restricting use of valuable storage capacity until the data itself is reused or forced out of the RAM.

It follows that conventional implementations of RAM and the management of data therein have suffered from inefficiencies stemming from the foregoing issues. These inefficiencies have also had negative effects on performance of the overarching storage systems as a whole.

SUMMARY

A computer-implemented method, according to one approach, includes: receiving a stream of incoming I/O requests. One or more buffers in a primary cache are used to satisfy all of the incoming I/O requests, where the primary cache is coupled to a secondary cache and a data storage device. An available capacity of the one or more buffers in the primary cache are also monitored. In response to determining that the available capacity of the one or more buffers in the primary cache is outside a predetermined range: one or more buffers in the secondary cache are allocated. These one or more buffers in the secondary cache are used to satisfy at least some of the incoming I/O requests, while the one or more buffers in the primary cache are used to satisfy a remainder of the incoming I/O requests. Moreover, in response to determining that the available capacity of the one or more buffers in the primary cache is not outside the predetermined range: the one or more buffers in the primary cache are again used to satisfy all of the incoming I/O requests.

It follows that the different performance characteristics associated with each of the types of memory in cache may be utilized in a predetermined manner. For instance, the primary cache having higher performance characteristics (e.g., a tier having DRAM) may be used as a default to satisfy any incoming I/O requests, while a secondary cache having lower performance characteristics (e.g., a tier having SCM) is reserved for workload intensive situations. Moreover, the primary and secondary cache may be different tiers in a same overarching cache module. It follows that the lower performance tier of the cache module is utilized in situations where the higher performance tier of the cache module is unable to keep up with the influx of I/O requests, e.g., as will be described in further detail below. This allows the overall storage system to operate more efficiently while also increasing the longevity of the physical memory components.

Furthermore, in some situations a workload having a number of I/O requests may be anticipated. Thus, a determination may be made as to whether the primary cache will be able to satisfy the number of I/O requests in the anticipated workload without causing the available capacity of the one or more buffers in the primary cache to fall outside the predetermined range. In response to determining that the primary cache will not be able to satisfy the number of I/O requests in the anticipated workload without causing the available capacity of the one or more buffers in the primary cache to fall outside the predetermined range, one or more buffers in the secondary cache can be allocated. The one or more buffers in the secondary cache are thereby used to satisfy the number of I/O requests in the anticipated workload, while the one or more buffers in the primary cache are used to satisfy a remainder of the incoming I/O requests.

It follows that by anticipating a workload of a particular size (e.g., having a certain number of I/O requests), the cache may be able to determine whether it will be able to satisfy the workload without experiencing a cache overflow or bottleneck situation. Moreover, cache overflow and bottleneck situations may be avoided by utilizing the secondary cache in situations where the anticipated workload is sufficiently large, thereby improving performance of the system.

A computer program product, according to another approach, includes a computer readable storage medium having program instructions embodied therewith. The program instructions are readable and/or executable by a processor to cause the processor to: perform the foregoing method.

A system, according to yet another approach, includes: a processor, and logic that is integrated with the processor, executable by the processor, or integrated with and executable by the processor. The processor is coupled to a primary cache and a secondary cache. Moreover, the logic is configured to: perform the foregoing method.

Other aspects and approaches of the present invention will become apparent from the following detailed description, which, when taken in conjunction with the drawings, illustrate by way of example the principles of the invention.

BRIEF DESCRIPTION OF THE DRAWINGS

FIG. 3 is a system diagram, in accordance with one approach.

FIG. 4 is a conceptual diagram which includes a block-stripe and page-stripe, in accordance with one approach.

DETAILED DESCRIPTION

Figure 1:
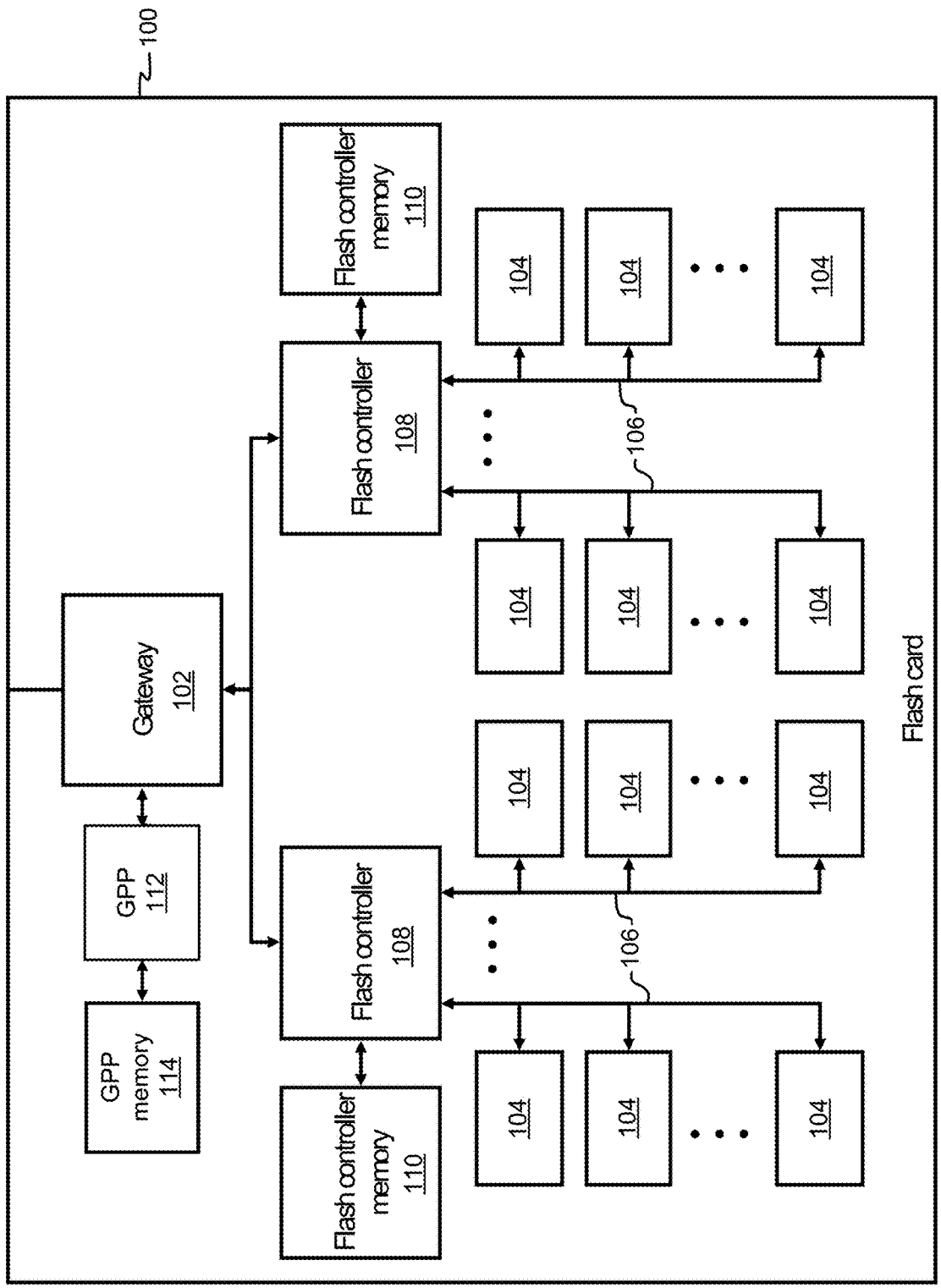
FIG. 1 is a diagram of a non-volatile memory card, in accordance with one approach.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred approaches of data storage systems, as well as operation and/or component parts thereof. It should be appreciated that various approaches herein can be implemented with a wide range of memory mediums, including for example non-volatile random access memory (NVRAM) technologies such as NAND Flash memory, NOR Flash memory, phase-change memory (PCM), magnetoresistive RAM (MRAM), resistive RAM (RRAM), etc. To provide a context, and solely to assist the reader, various approaches herein may be described with reference to a particular type of non-volatile memory. This has been done by way of example only, and should not be deemed limiting on the invention defined in the claims.

In one general approach, a computer-implemented method includes: receiving a stream of incoming I/O requests. One or more buffers in a primary cache are used to satisfy all of the incoming I/O requests, where the primary cache is coupled to a secondary cache and a data storage device. An available capacity of the one or more buffers in the primary cache are also monitored. In response to determining that the available capacity of the one or more buffers in the primary cache is outside a predetermined range: one or more buffers in the secondary cache are allocated. These one or more buffers in the secondary cache are used to satisfy at least some of the incoming I/O requests, while the one or more buffers in the primary cache are used to satisfy a remainder of the incoming I/O requests. Moreover, in response to determining that the available capacity of the one or more buffers in the primary cache is not outside the predetermined range: the one or more buffers in the primary cache are again used to satisfy all of the incoming I/O requests.

In another general approach, a computer program product includes a computer readable storage medium having program instructions embodied therewith. The program instructions are readable and/or executable by a processor to cause the processor to: perform the foregoing method.

In yet another general approach, a system includes: a processor, and logic that is integrated with the processor, executable by the processor, or integrated with and executable by the processor. The processor is coupled to a primary cache and a secondary cache. Moreover, the logic is configured to: perform the foregoing method.

FIG. 1 illustrates a memory card 100, in accordance with one approach. It should be noted that although memory card 100 is depicted as an exemplary non-volatile data storage card in the present approach, various other types of non-volatile data storage cards may be used in a data storage system according to alternate approaches. It follows that the architecture and/or components of memory card 100 are in no way intended to limit the invention, but rather have been presented as a non-limiting example.

Moreover, as an option, the present memory card 100 may be implemented in conjunction with features from any other approach listed herein, such as those described with reference to the other FIGS. However, such memory card 100 and others presented herein may be used in various applications and/or in permutations which may or may not be specifically described in the illustrative approaches listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed dynamic random access memory (DRAM), phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various approaches, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various approaches.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various approaches described herein. However, depending on the desired approach, the controller memory 110 may be battery-backed DRAM, phase-change memory PC-RAM, MRAM, STT-MRAM, etc., or a combination thereof.

Figure 2:
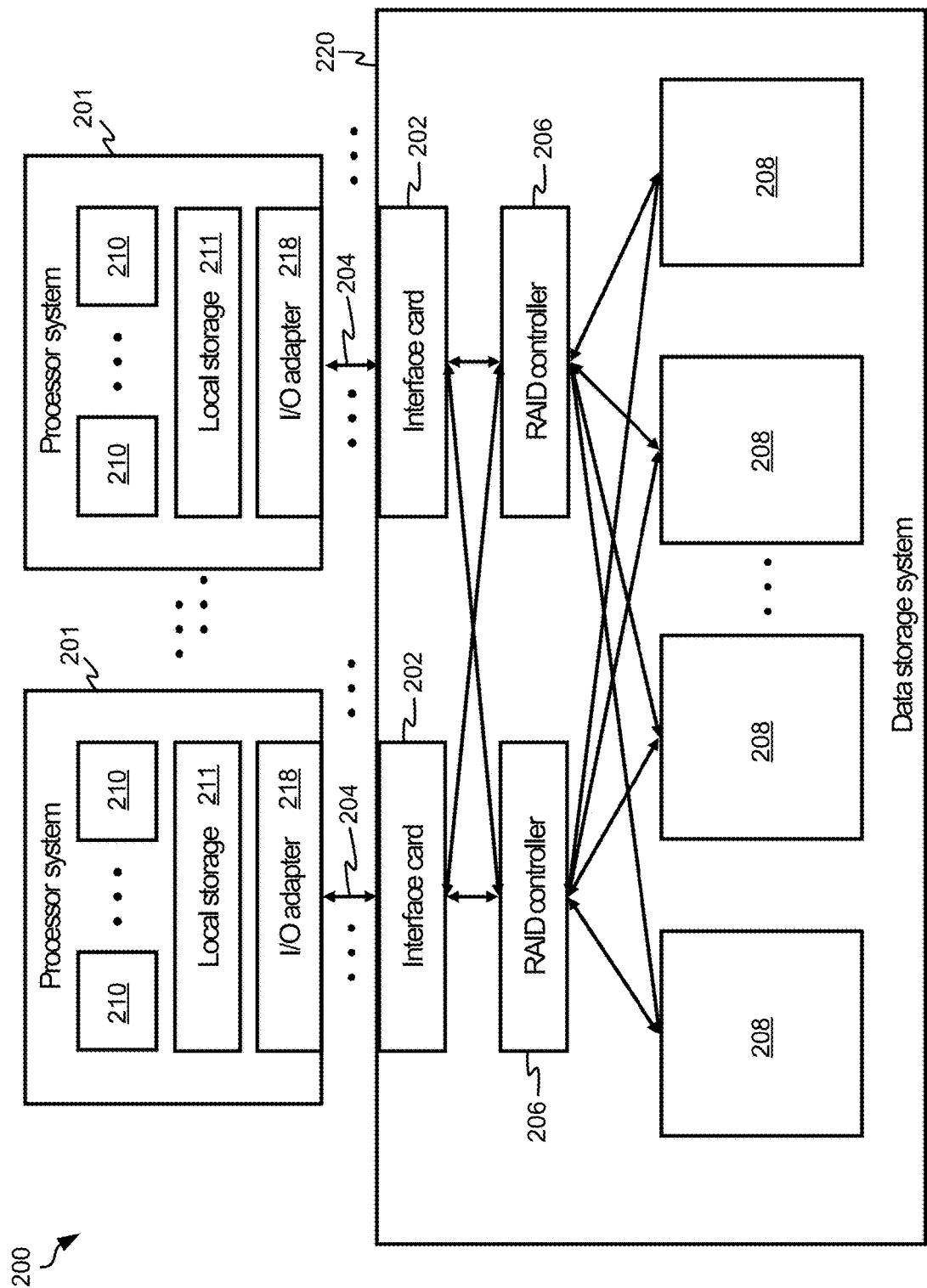
FIG. 2 is a diagram of a data storage system architecture, in accordance with one approach.

As previously mentioned, memory card 100 may be implemented in various types of data storage systems, depending on the desired approach. FIG. 2 illustrates a data storage system architecture 200 according to an exemplary approach which is in no way intended to limit the invention. Moreover, it should be noted that the data storage system 220 of FIG. 2 may include various components found in the approach of FIG. 1.

Looking to FIG. 2, the data storage system 220 comprises a number of interface cards 202 configured to communicate via I/O interconnections 204 to one or more processor systems 201. The data storage system 220 may also comprise one or more RAID controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 814 of FIG. 8, ROM 816 of FIG. 8, etc.), and an I/O adapter 218 configured to communicate with the data storage system 220.

Referring again to FIG. 1, memory controllers 108, GPP 112, and/or other controllers described herein (e.g., RAID controllers 206 of FIG. 2) may be able to perform various functions on stored data, depending on the desired approach. Specifically, memory controllers or GPP 112 may include logic configured to perform any one or more of the following functions, which are in no way intended to be an exclusive list. In other words, depending on the desired approach, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, logic erase blocks (LEBs) may be identified for being reclaimed and/or relocated. Typically, one LEB corresponds to one block stripe, but alternative implementations may consider a fixed number of block stripes or a single block building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or flash channels are grouped together, such that blocks from the same group can be read or written in parallel, thereby increasing overall bandwidth. It is also possible to combine the previous two methods, and to compose RAID stripes using blocks from different flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary approach, which is in no way intended to limit the invention, memory controllers (e.g., see 108 and/or GPP 112 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the logical-to-physical table (LPT) mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some approaches. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, heat segregation may be achieved. In particular, heat segregating methods may group hot memory pages together in certain memory blocks while cold memory pages are grouped together in separate memory blocks. Thus, a heat segregated LEB tends to be occupied by either hot or cold data.

The merit of heat segregation is two-fold. First, performing a garbage collection process on a hot memory block will prevent triggering the relocation of cold data as well. In the absence of heat segregation, updates to hot data, which are performed frequently, also results in the undesirable relocations of all cold data collocated on the same LEB as the hot data being relocated. Therefore, the write amplification incurred by performing garbage collection is much lower for approaches implementing heat segregation.

Secondly, the relative heat of data can be utilized for wear leveling purposes. For example, hot data may be placed in healthier (e.g., younger) memory blocks, while cold data may be placed on less healthy (e.g., older) memory blocks relative to those healthier memory blocks. Thus, the rate at which relatively older blocks are exposed to wear is effectively slowed, thereby improving the overall endurance of a given data storage system implementing heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired approach, logic of a storage system may be configured to perform additional or alternative functions, as would be appreciated by one skilled in the art upon reading the present description.

Referring now to FIG. 3, a system 300 is illustrated in accordance with one approach. As an option, the present system 300 may be implemented in conjunction with features from any other approach listed herein, such as those described with reference to the other FIGS. However, such system 300 and others presented herein may be used in various applications and/or in permutations which may or may not be specifically described in the illustrative approaches listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired approach. According to an exemplary approach, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages in memory. According to an example, which is in no way intended to limit the invention, the LPT manager 308 may maintain the logical-to-physical mappings of 4 KiB or 16 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

To better understand the distinction between block-stripes and page-stripes as used herein, FIG. 4 is a conceptual diagram 400, in accordance with one approach. LEBs are built from block stripes and typically a single block stripe is used to build a LEB. However, alternative approaches may use multiple block stripes to form an LEB. As an option, the present conceptual diagram 400 may be implemented in conjunction with features from any other approach listed herein, such as those described with reference to the other FIGS. However, such conceptual diagram 400 and others presented herein may be used in various applications and/or in permutations which may or may not be specifically described in the illustrative approaches listed herein. Further, the controller conceptual diagram 400 presented herein may be used in any desired environment. Thus, the exemplary non-volatile memory controller conceptual diagram 400 of FIG. 4 may be implemented in a cache architecture. However, depending on the desired approach, the conceptual diagram 400 of FIG. 4 may be implemented in defining the organization of data stored in non-volatile memory. Accordingly, both implementations are described in turn below.

Non-Volatile Memory

Looking now to FIG. 4, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel may form a respective block-stripe. It follows that a number of block-stripes supported by a given approach of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4, the multiple blocks of aggregated Plane 0 constitute Block-stripe 0. While all blocks in a block-stripe typically belong to the same aggregated plane, in some approaches one or more blocks of a block-stripe may belong to different physical planes. It follows that each aggregated plane may include one or more block-stripe. Thus, according to an illustrative approach, Block 0 through Block 10 from different physical planes may constitute a block-stripe.

Regardless of whether the conceptual diagram 400 of FIG. 4 is implemented with non-volatile memory and/or a cache architecture, in different approaches, the number of pages in each block and/or the number of channels in each plane may vary depending on the desired approach. According to an exemplary approach, which is in no way intended to limit the invention, a block may include 256 pages, but could include more or fewer in various approaches. Analogously, the number of channels per plane and/or the number of planes may vary depending on the desired approach.

Referring still to FIG. 4, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

As previously mentioned, RAM is a type of memory which operates in a fundamentally unique manner compared to traditional sequential access memory. While this fundamentally different manner of operation allows for RAM to achieve faster read and write performance in comparison to sequential access memory, the physical cells that store bits of information therein can only be written to a finite number of times before they begin to wear out. For instance, the RBER of a memory block in RAM will typically increase over time due to additional P/E cycling, charge leakage over time (i.e., data retention), and additional charge placed in the cells by read or program operations (i.e., read or program disturb errors, respectively). As a result, write operations performed in RAM have a lasting effect on memory longevity, particularly in conventional storage implementations.

RAM also has a higher cost associated therewith in comparison to sequential access memory. As a result, storage capacity in RAM implementations is typically limited and operations involving larger amounts of data create performance bottlenecks. Similarly, data that has been recalled to RAM to perform an operation may not be used again for a substantial amount of time, thereby polluting the RAM by restricting use of valuable storage capacity until the data itself is reused or forced out of the RAM. Limited storage capacity in RAM also magnifies the accumulation of wear caused by write operations that are performed therein.

Conventional implementations of RAM and the management of data stored therein have suffered from inefficiencies stemming from the foregoing issues. These inefficiencies have also had negative effects on performance of the overarching storage systems as a whole.

In sharp contrast to the foregoing shortcomings experienced in conventional implementations, various ones of the approaches included herein introduce multi-tiered cache, where each tier of the cache utilizes a different type of RAM having a different level of performance associated therewith. This allows for a higher performance tier of RAM to be used as a default for satisfying received data operations, while a lower performance tier of RAM is used as a backup in high workload situations and/or to perform a certain types of data operations. As a result, these approaches are not only able to achieve efficient performance of I/O requests by utilizing the performance characteristics of the different tiers to avoid bottleneck situations, but also increase the overall performance of the system, e.g., as will be described in further detail below.

Figure 5:
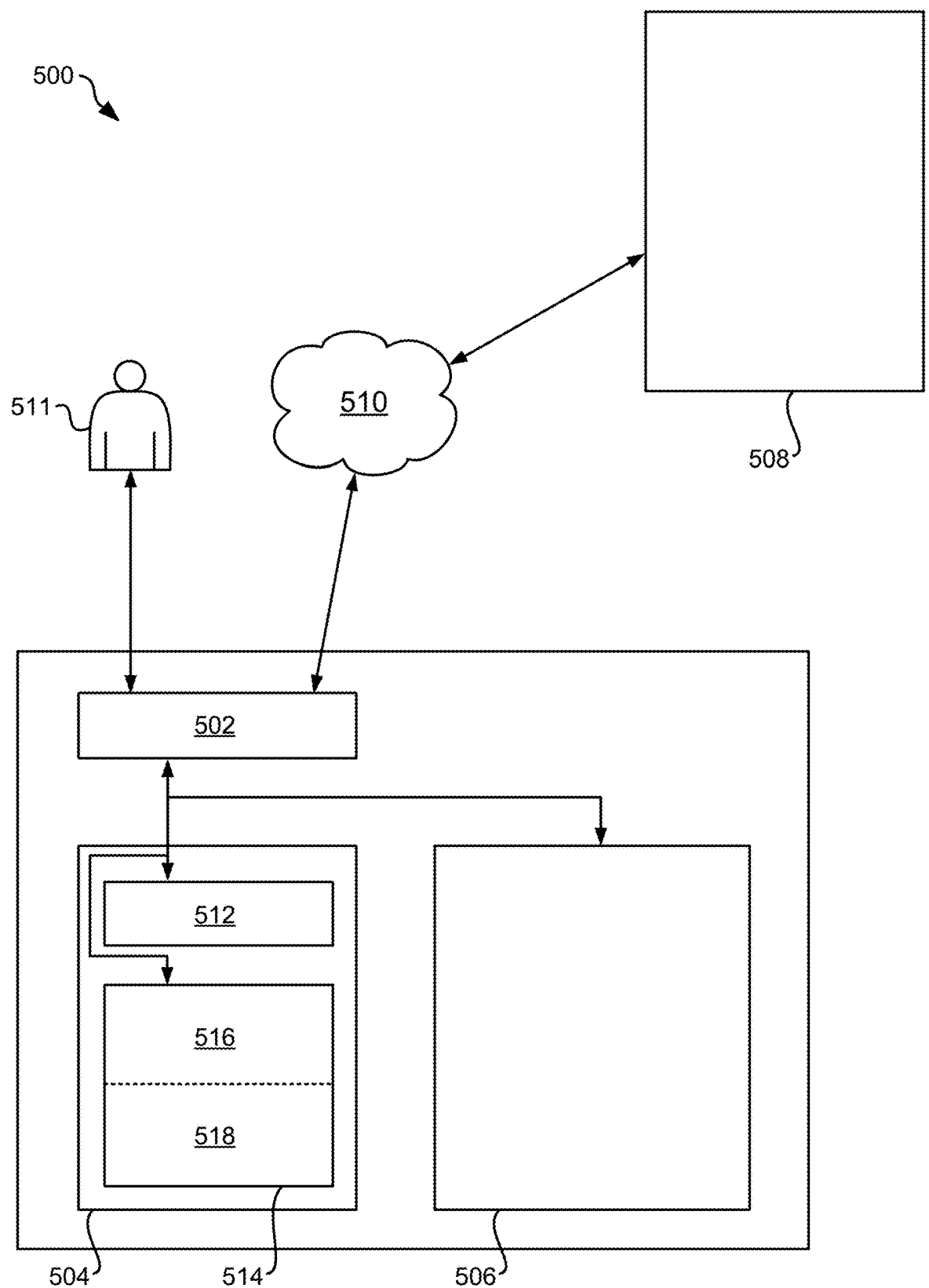
FIG. 5 is a partial representational view of a data storage system, in accordance with one approach.

Looking now to FIG. 5, a data storage system 500 is illustrated in accordance with one approach. As an option, the present data storage system 500 may be implemented in conjunction with features from any other approach listed herein, such as those described with reference to the other FIGS. However, such data storage system 500 and others presented herein may be used in various applications and/or in permutations which may or may not be specifically described in the illustrative approaches listed herein. Further, the data storage system 500 presented herein may be used in any desired environment. Thus FIG. 5 (and the other FIGS.) may be deemed to include any possible permutation.

As shown, the data storage system 500 includes a controller 502 which is coupled to a cache module 504 and a local data storage device 506. Depending on the implementation, the controller 502 may be coupled to the cache module 504 and/or the local data storage device 506 using a wireless connection, e.g., WiFi, Bluetooth, a cellular network, etc.; a physical electrical connection, e.g., a cable, a fiber-optic link, a wire, etc.; etc., or any other type of connection which would be apparent to one skilled in the art after reading the present description.

The controller 502 is also coupled to a remote data storage location 508 via a network 510, e.g., as will be described in further detail below. The controller 502 may be any desired type of controller, e.g., such as a central storage controller, a data processor, a general computing device, etc., or some other device having one or more processors included therein. Accordingly, the controller 502 may be able to receive and satisfy I/O requests from a host 511, running applications, other data storage systems that are connected to the network 510, etc.

The local data storage device 506 may include one or more different types of data storage components including, but not limited to, HDDs, tape libraries, SSDs, etc. The local data storage device 506 may thereby serve as an on-location data storage option for the controller 502. An effective storage capacity of the local data storage device 506 may also vary depending on the type(s) of data storage component(s) included therein, anticipated throughput of the system 500, etc.

While the local data storage device 506 is able to store data for the system 500, the remote data storage location 508 provides additional storage capacity that may be utilized as desired. Moreover, the remote data storage location 508 may be positioned at any desired location so long as it is able to maintain a connection with the network 510. It follows that the network 510 may be of any type, e.g., depending on the desired approach. For instance, in some approaches the network 510 is a WAN, e.g., such as the Internet. However, an illustrative list of other network types which network 510 may implement includes, but is not limited to, a LAN, a PSTN, a SAN, an internal telephone network, etc. Accordingly, the controller 502 and the remote data storage location 508 are able to communicate with each other regardless of the amount of separation which exists therebetween, e.g., despite being positioned at different geographical locations.

In some approaches, the remote data storage location 508 may be cloud object storage implemented as a part of a cloud computing environment (e.g., see FIGS. 10-11 below). In such approaches, data may be recalled directly from storage in the cloud computing environment and into the cache module 504. This recalled data can replace the current hot data in the cache 504, however some of the recalled data may not be actually used for some time. Accordingly, portions of the recalled data may effectively pollute the cache 504, especially the primary cache 512, until it is flushed out (e.g., ages out). To solve this issue, some of the recalled data may selectively bypass the primary cache 512 and be stored in secondary cache 514. The data recall operations are able to distinguish the basis of the data recall and decide if the data should be transitioned into the primary cache 512 or secondary cache 514, e.g., as will be described in further detail below with respect to FIGS. 6A-6D.

With continued reference to FIG. 5, the cache module 504 includes a primary cache 512 and a secondary cache 514. Each of the primary and secondary cache 512, 514 preferably have different performance characteristics associated therewith. For instance, the primary cache 512 preferably has higher performance characteristics than the performance characteristics of the secondary cache 514. The performance characteristics may include and/or be determined based on achievable data throughput, data access times, write performance, etc., e.g., depending on the desired approach.

According to an exemplary approach, which is in no way intended to limit the invention, the primary cache 512 includes DRAM while the secondary cache 514 includes storage class memory (SCM). As such, the DRAM in the primary cache 512 is able to read and/or write data more quickly than the SCM in the secondary cache 514. However, access to data in SCM is significantly quicker than access to data in sequential access memory (e.g., such as HDDs), and even SSDs.

For example, SCM is a type of NVRAM which is able to perform read and write operations up to 10 times faster than NAND Flash drives in addition to being more durable. SCM is even capable of achieving log speeds that are nearly as fast as DRAM and static random access memory (SRAM). In view of the lower price associated with SCM in comparison to DRAM, the storage capacity of the secondary cache 514 is preferably much greater than that of the primary cache 512, thereby enabling the secondary cache 514 to store significantly more data than the primary cache 512. SCM also includes a power source to ensure that data is not lost due to a system crash or power failure, thereby providing a desirable combination of persistence and speed.

SCM is thereby capable of providing a number of benefits, including significantly fast database-server restarts during maintenance, power emergencies, expected and/or unexpected reboots, etc. Various operational applications and databases, especially those that desire low-latency, high durability, and strong data consistency, can benefit from the implementation of SCM in the secondary cache 514. Moreover, SCM is capable of delivering higher performance to multi-node, distributed-cloud applications in some approaches.

The secondary cache 514 of FIG. 5 further includes a first tier 516 and a second tier 518 therein. In preferred approaches, the performance characteristics associated with (e.g., achievable by) the first tier 516 of the secondary cache 514 are greater than the performance characteristics associated with the second tier of 518 of the secondary cache 514. In other words, although the secondary cache 514 preferably exhibits lower performance characteristics in comparison to the performance characteristics of the primary cache 512, different tiers in the secondary cache 514 may also exhibit different levels of performance characteristics.

This can be true even in situations where both tiers of the secondary cache 514 include the same type of memory therein. According to an example, which is in no way intended to limit the invention, the first tier 516 and the second tier 518 in the secondary cache 514 both include SCM. Thus, the first tier 516 in the secondary cache 514 preferably includes an implementation of SCM that has higher performance characteristics than the SCM implemented in the second tier 518 in the secondary cache 514. As noted above, the performance characteristics of a given portion of memory (e.g., tier in cache) may include and/or be determined based on achievable data throughput, data access times, write performance, etc., e.g., depending on the desired approach. The first tier 516 in the secondary cache 514 may thereby include SCM which has a greater effective storage capacity, has experienced a fewer number of write operations thereby resulting in a greater average block health therein, is able to read data more quickly, etc., in comparison to the SCM that is included in the second tier 518 in the secondary cache 514, e.g., as would be appreciated by one skilled in the art after reading the present description.

Referring still to data storage system 500, the cache 504 provides memory which is able to satisfy I/O requests that are received in a much more efficient manner with respect to computing resources as well as time in comparison to the local data storage device 506 and/or the remote data storage location 508. Moreover, by including a number of different types of memory in the different portions and/or tiers of the cache 504, the controller 502 may further improve the efficiency by which I/O requests are satisfied by selectively utilizing the different performance characteristics. In some approaches, the I/O requests themselves may even indicate which portion(s) of the multi-tiered cache 504 should be used to satisfy the respective I/O requests.

This selective implementation of different cache tiers to satisfy I/O requests significantly improves the performance not only of the I/O requests themselves, but also the overarching system. As noted above, a higher performance tier in cache (e.g., see primary cache 512) may be used as a default to satisfy incoming I/O requests, while a lower performance tier (e.g., see secondary cache 514) in the cache is reserved for intensive workload situations. However, in some approaches a particular tier of cache may be used to satisfy an I/O request based at least in part on an anticipated workload of the I/O request and/or other information that may be received with the I/O request.

Standard I/O requests include read requests and write requests. Moreover, for synchronous I/O requests, restrictions exist which stipulate the types of track formats and access patterns that are valid. For instance, synchronous I/O requests are only performed when all associated resources are readily available, e.g., such that there is no wait during the I/O processing. In some approaches, synchronous read requests leverage special control structures to define the format of the track that is to be accessed. One such illustrative structure is the "mini-tfd" which is a simplified track format descriptor that maintains a subset of the critical information involved with describing a track. Only tracks with a standard, synchronous compatible format can have an associated mini-tfd.

Referring momentarily again to FIG. 5, controller 502 may perform any one or more of the processes described below with respect to method 600 in order to process incoming I/O requests, e.g., as will soon become apparent. However, it should be noted that the various processes described below in FIGS. 6A-6F can be performed by any desired controller, processor, computing device, etc., which may be included in the data storage system 500, e.g., as would be appreciated by one skilled in the art after reading the present description. According to an example, which is in no way intended to limit the invention, the cache 504 and/or the components included therein may include one or more processors, the local data storage device 506 may include one or more controllers, the remote data storage location 508 may include a data management processor, etc., any of which may perform one or more of the processes described below.

Figure 6A:
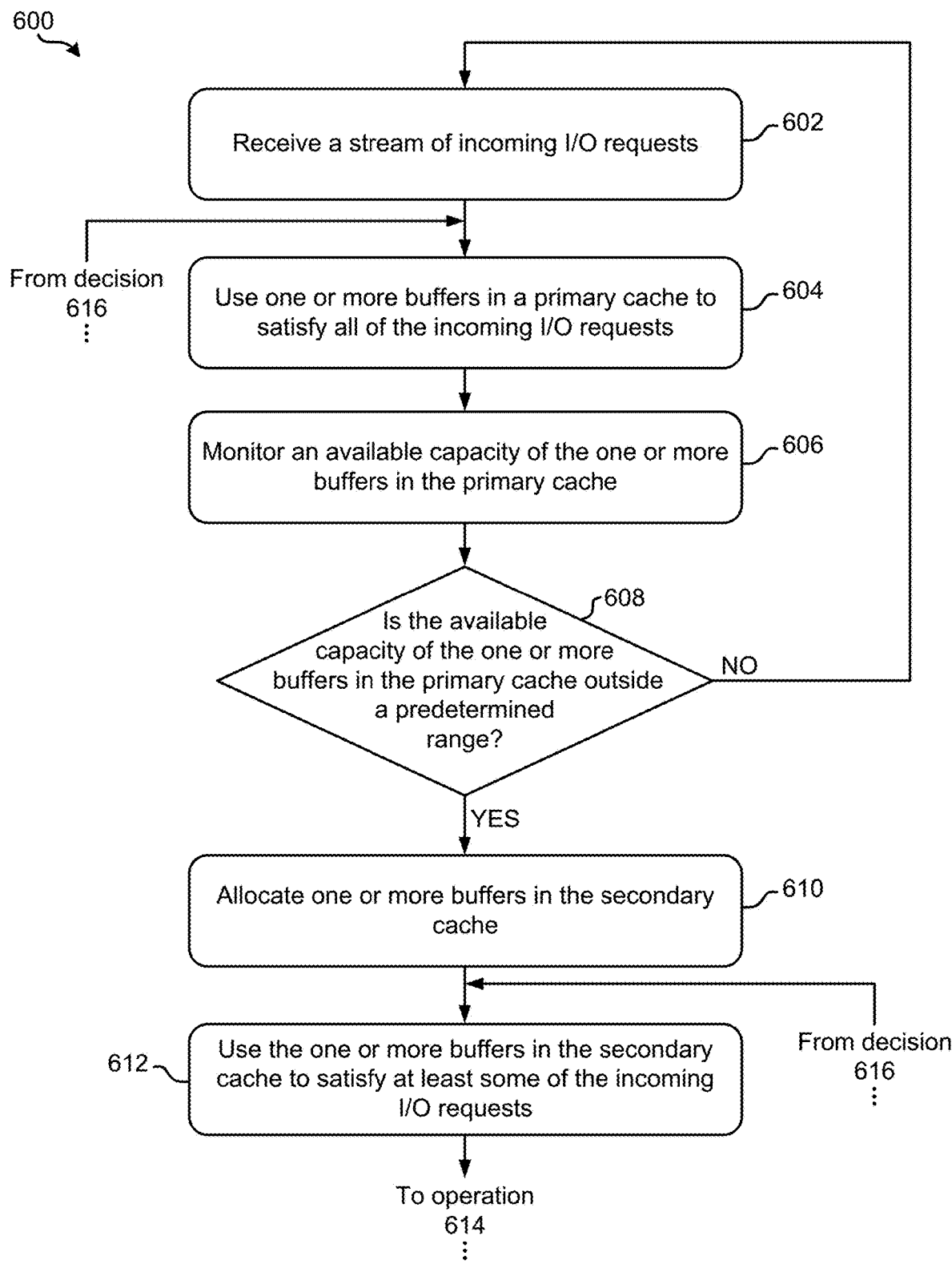
FIG. 6A is a flowchart of a method, in accordance with one approach.
Figure 6A:
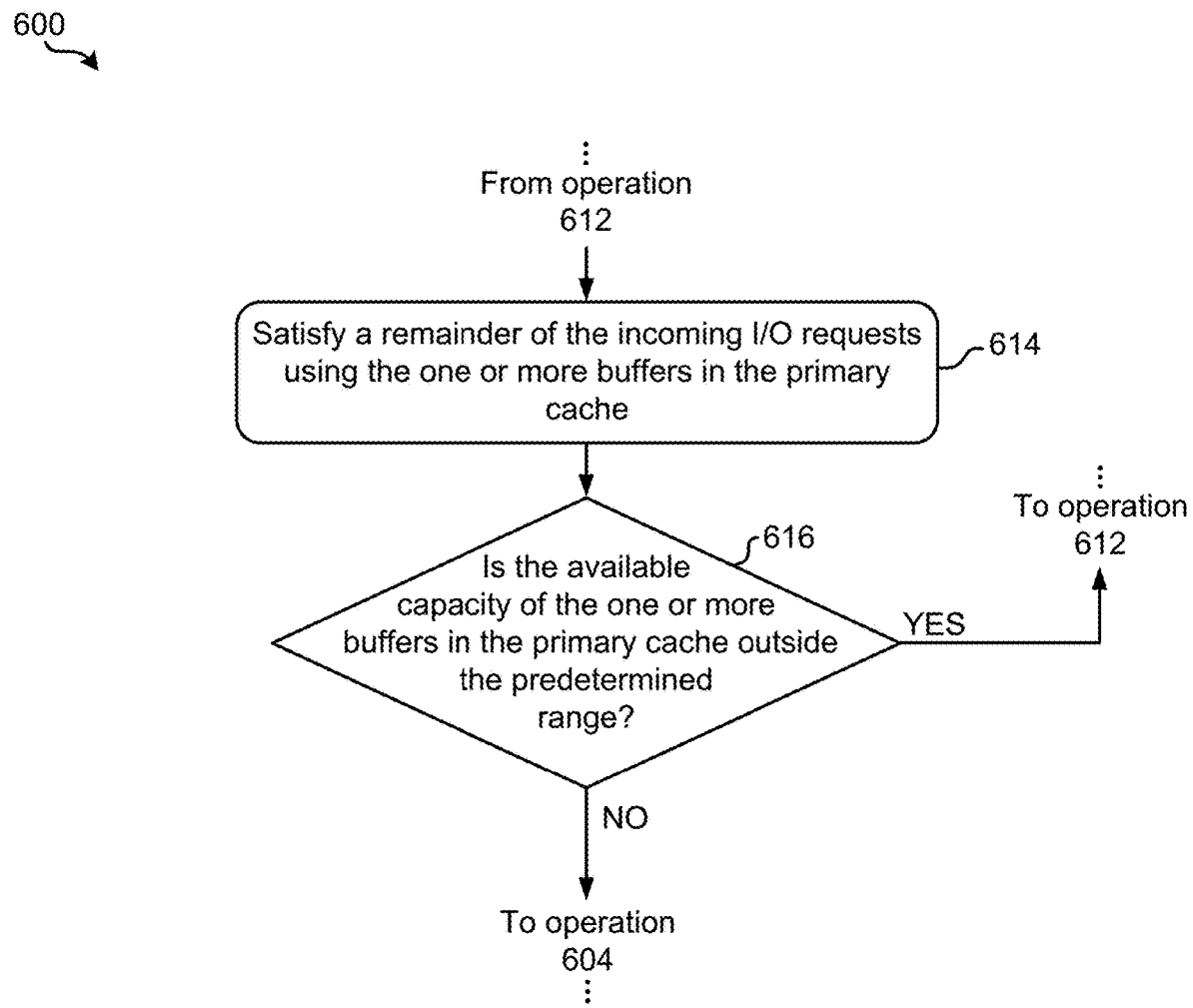

Referring now to FIG. 6A, a method 600 for using multi-tiered cache having different respective performance levels to satisfy I/O requests is illustrated in accordance with one approach. The method 600 may be performed in accordance with the present invention in any of the environments depicted in FIGS. 1-5, among others, in various approaches. Of course, more or less operations than those specifically described in FIG. 6A may be included in method 600, as would be understood by one of skill in the art upon reading the present descriptions.

Each of the steps of the method 600 may be performed by any suitable component of the operating environment. For example, in various approaches, the method 600 may be partially or entirely performed by a controller, a processor, a computer, etc., or some other device having one or more processors therein. Thus, in some approaches, method 600 may be a computer-implemented method. In such approaches, the computer used to implement the method may include the tape drive itself or a portion thereof such as the controller, the tape, an external host, a server, etc. Moreover, the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6A, operation 602 of method 600 includes receiving a stream of incoming I/O requests. The stream of I/O requests may be received at different rates and/or intensities depending on a number of factors, e.g., such as the workloads being processed by the system, a number of active applications, the type of I/O requests that are being received, the time of day, etc. For instance, in some instances I/O requests may be received in a steady stream that maintains a sufficiently even rate over a period of time, while in other instances I/O requests may be received in batches, in varying intensities, etc.

The type of I/O requests received in operation 602 may also vary depending on the situation. For instance, the I/O requests may include read requests, new write requests, modify write requests, deletion requests, etc. Moreover, in some approaches the I/O requests may be synchronous I/O requests. However, other approaches may involve receiving asynchronous I/O requests, or other types of I/O requests which would be apparent to one skilled in the art after reading the present description.

Again, the different performance characteristics associated with each of the types of memory in cache may be utilized in a predetermined manner. According to preferred approaches, a primary cache having higher performance characteristics (e.g., a tier having DRAM) may be used as a default to satisfy any incoming I/O requests, while a secondary cache having lower performance characteristics (e.g., a tier having SCM) is reserved for workload intensive situations. Moreover, the primary and secondary cache may be different tiers in a same overarching cache module. It follows that the lower performance tier of the cache module is utilized in situations where the higher performance tier of the cache module is unable to keep up with the influx of I/O requests, e.g., as will be described in further detail below. This allows the overall storage system to operate more efficiently while also increasing the longevity of the physical memory components.

However, in some situations the controller performing method 600 may be able to select which tier in cache is to be used to perform a given I/O request, sometimes using information included in the I/O requests themselves. For instance, the I/O request may include a designated flag, portion of metadata, header information, etc., which designates whether a portion of cache having a relatively high performance should be used to satisfy the I/O request, or a portion of cache having a relatively low performance should be used. This distinction may be made as a result of performing a preliminary evaluation of the I/O request, based on performance experienced in response to previous I/O requests, predicted workloads, etc. It should also be noted that "higher performance" and "lower performance" as used herein are intended to at least be with respect to each other. Thus, higher performance cache tier is capable of performance characteristics which are at least higher than performance characteristics of the lower performance cache tier.

Referring still to FIG. 6A, method 600 proceeds from operation 602 to operation 604. There, operation 604 includes using one or more buffers in a primary cache to satisfy all of the incoming I/O requests. In other words, each of the I/O requests that are received are added to one or more buffers in the primary cache such that the I/O requests are satisfied by the primary cache. As noted above, although the cache may include different tiers of memory, each having different performance characteristics associated therewith, it is preferred that a higher performance tier of the cache is used as a default to satisfy incoming I/O requests. Thus, as I/O requests are received, they are preferably sent to the higher performance tier by default. This allows for the cache to achieve a high level of performance during standard operation which improves the operating efficiency of the system as a whole. For example, the primary cache may be coupled to a secondary cache as well as a data storage device (e.g., see data storage system 500 of FIG. 5 above). Accordingly, the primary cache may include DRAM while the secondary cache includes at least one tier of SCM.

It should be noted that although it is desirable the incoming I/O requests are satisfied by the primary cache as a default during nominal operation, other cache (e.g., the secondary cache) may be utilized to satisfy at least some of the incoming I/O requests in certain situations. For instance, it may be desirable that certain types of I/O requests are satisfied using a type of cache other than the primary cache. According to an example, which is in no way intended to limit the invention, write intensive I/O requests received during a workload intensive period may be satisfied using SCM in secondary cache. In other instances, a majority of incoming I/O requests may be satisfied by the primary cache, while a remainder of the I/O requests are satisfied using the secondary cache.

With continued reference to operation 604, the one or more buffers in the primary cache that are used to satisfy incoming I/O requests may be preexisting in some approaches. In other words, the buffers may have been previously formed and maintained in the cache. However, in other approaches one or more of the buffers may be formed during the process of performing operation 604. The number, size, type, etc. of the buffers that are formed in such approaches may vary depending on the number of incoming I/O requests, input provided by a user, a number of buffers which already exist in the primary cache, an amount of the primary cache which is unused, etc. It should also be noted that the one or more buffers may be formed using any processes which would be apparent to one skilled in the art after reading the present description.

Operation 606 further includes monitoring an available capacity of the one or more buffers in the primary cache. In other words, operation 606 includes monitoring how much of the primary cache remains unused as I/O requests are continually received and added to the buffers of the primary cache. By monitoring the primary cache, method 600 is desirably able to identify situations in which the primary cache is being overutilized such that proactive steps may be taken to avoid cache overflow. The system is thereby able to satisfy incoming I/O requests in an efficient manner while also avoiding any processing delays caused by cache bottlenecks.

This process of monitoring the primary cache may be performed differently depending on the approach. For instance, in some situations the available capacity of the primary cache may be monitored by comparing a record of incoming I/O requests with a record of satisfied I/O requests to determine a number of I/O requests that still remain in the primary cache. In other situations, the entries in the primary cache themselves may be inspected, a lookup table may be accessed, etc., or any other processes of monitoring the primary cache which would be apparent to one skilled in the art after reading the present description.

From operation 606, method 600 proceeds to decision 608 which includes determining whether the available capacity of the one or more buffers in the primary cache is outside a predetermined range. In other words, decision 608 determines whether the primary cache is undesirably full. The predetermined range may be set by a user, be based on industry standards, determined based on the total capacity of the primary cache, etc. However, in some approaches the predetermined range may actually dynamically change based on current performance. It should also be noted that "outside a predetermined range" is in no way intended to limit the invention. Rather than determining whether a value is outside a predetermined range, equivalent determinations may be made, e.g., as to whether a value is above a threshold, whether a value is outside a predetermined range, whether an absolute value is above a threshold, whether a value is below a threshold, etc., depending on the desired approach.

In response to determining that the available capacity of the one or more buffers in the primary cache is not outside a predetermined range, method 600 returns to operation 602. Thus, additional I/O requests may be received and processed by the primary cache in response to determining that it includes a sufficient amount of capacity to do so. However, it should be noted that I/O requests may continue to be received in a stream and processed in parallel according to the various processes in method 600. Thus, although method 600 returns to operation 602 from decision 608, additional I/O requests may have already been received and processed accordingly.

Returning to decision 608, method 600 proceeds to operation 610 in response to determining that the available capacity of the one or more buffers in the primary cache is outside a predetermined range. In other words, method 600 proceeds to operation 610 in response to determining that the primary cache is undesirably full. There, operation 610 includes allocating one or more buffers in the secondary cache. The number of buffers allocated in the secondary cache may depend on the number of I/O requests that have been received, the amount of available capacity that remains in the primary cache, the current I/O turnover rate, the type of I/O request, type of data operation, task requirements, etc. Moreover, the one or more buffers may be allocated using any processes which would be apparent to one skilled in the art after reading the present description.

The one or more buffers in the secondary cache are thereby used to satisfy at least some of the incoming I/O requests. See operation 612. The number of the incoming I/O requests that are satisfied by the buffers which have been allocated in the secondary cache varies depending on the approach. For instance, in some approaches it is preferred that a majority of the incoming I/O requests are satisfied using the one or more buffers in the secondary cache. In other approaches all of the incoming I/O requests may be satisfied using the one or more buffers in the secondary cache. This allows for the primary cache to focus on flushing accumulated I/O requests and increasing the available capacity of the primary cache. In such approaches, a greater number of buffers and/or larger buffers may be allocated. However, in other approaches a minority of the incoming I/O requests may be satisfied using the buffers in the secondary cache. Accordingly, a smaller number of buffers and/or smaller buffers may be allocated.

Proceeding to operation 614, a remainder of the incoming I/O requests are satisfied using the one or more buffers in the primary cache. In other words, any incoming I/O requests which are not being satisfied using the buffers in the secondary cache are satisfied using the buffers in the primary cache. As noted above, it is preferred that the buffers in the secondary cache are used to satisfy a majority (if not all) of the incoming I/O requests such that the I/O requests which have accumulated in the primary cache may be flushed out, thereby making room for additional I/O requests.

Method 600 preferably allows some time to pass before proceeding from operations 612 and 614 to decision 616. This allows for the I/O requests that have accumulated in the primary cache to be processed and flushed out of the cache. In some approaches, the flowchart proceeds to decision 616 after a predetermined amount of time has passed, a predetermined number of I/O requests have been flushed from the primary cache, a request has been received from a user, etc. Looking now to decision 616, another determination is made as to whether the available capacity of the one or more buffers in the primary cache is still outside the predetermined range. In other words, decision 616 includes determining whether a sufficient number of I/O requests have been flushed from the primary cache such that the primary cache may resume responsibility for satisfying incoming I/O requests.

In response to determining that the available capacity of the one or more buffers in the primary cache is still outside the predetermined range, method 600 returns to operations 612 and 614, e.g., such that additional I/O requests may be flushed from the primary cache while the secondary cache is used to satisfy at least some of the incoming I/O requests. However, in response to determining that the available capacity of the one or more buffers in the primary cache is no longer outside the predetermined range, method 600 returns to operation 604. As a result, incoming I/O requests are satisfied using the one or more buffers in the primary cache, thereby reverting the system to a more efficient operating state after avoiding a potential cache bottleneck situation, e.g., as would be appreciated by one skilled in the art after reading the present description.

Figure 6B:
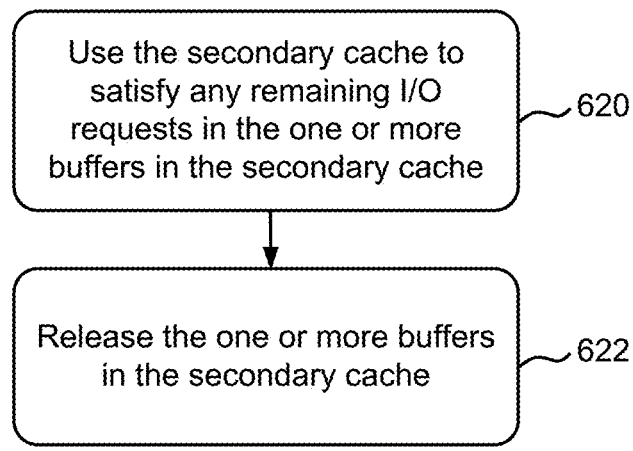
FIG. 6B is a flowchart of sub-processes for one or more of the operations in the method of FIG. 6A, in accordance with one approach.

Although the operational state of the primary cache may be restored in response to returning to operation 604, any number of unsatisfied I/O requests may remain in the one or more buffers in the secondary cache. In some approaches, these unfinished I/O requests may be satisfied by the secondary cache itself (e.g., see FIG. 6B below), while in other approaches they may be transferred to the primary cache such that they may be satisfied in a more efficient manner (e.g., see FIG. 6C below). Looking first to FIG. 6B, exemplary sub-processes of satisfying any I/O requests which remain in the secondary cache are illustrated in accordance with one approach, one or more of which may be used to perform method 600 of FIG. 6A. For instance, any one or more of the sub-processes in FIG. 6B may be performed in response to determining that the available capacity of the one or more buffers in the primary cache is no longer outside the predetermined range (e.g., see decision 616 of FIG. 6A above). However, it should be noted that the sub-processes of FIG. 6B are illustrated in accordance with one approach which is in no way intended to limit the invention.

As shown, sub-operation 620 includes using the secondary cache to satisfy any remaining I/O requests in the one or more buffers in the secondary cache. In other words, sub-operation 620 includes flushing any remaining I/O requests from the secondary cache. Moreover, sub-operation 622 includes releasing the one or more buffers in the secondary cache. The one or more buffers in the secondary cache may not be used at all in some approaches while the primary cache satisfies the incoming I/O requests. Thus, by releasing the buffers in the secondary cache when not in use, buffers may be allocated in the future as they are needed.

Figure 6C:
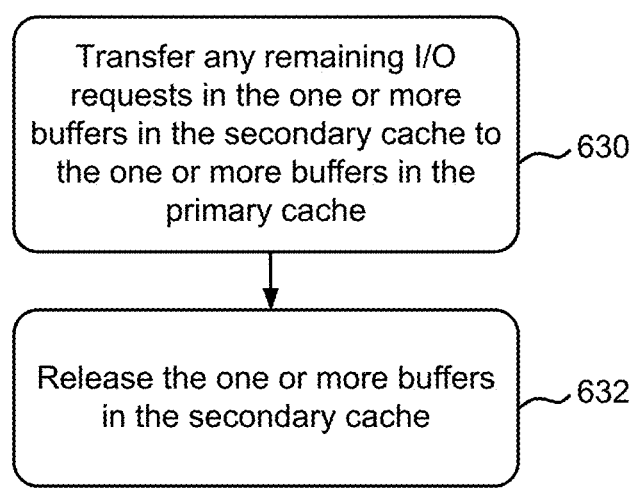
FIG. 6C is a flowchart of sub-processes for one or more of the operations in the method of FIG. 6A, in accordance with one approach.

However, looking now to FIG. 6C, sub-operation 630 includes transferring any remaining I/O requests in the one or more buffers in the secondary cache to the one or more buffers in the primary cache. Thus, rather than rely on the secondary cache to satisfy any remaining I/O requests after the primary cache has been reactivated, the flowchart of FIG. 6C utilizes the higher performance of the primary cache to complete the remaining I/O requests. This allows for the overarching system to complete the remaining I/O requests in a more efficient manner. Moreover, from sub-operation 630, the flowchart proceeds to sub-operation 632 whereby the one or more buffers in the secondary cache are released.

Although the processes described above with respect to FIG. 6A involve taking steps to prevent cache overflow situations in real time, some approaches are also able to utilize anticipated workloads to predict and prevent cache overflow. For instance, looking now to FIG. 6D, a method 650 for using an anticipated workload to predict whether a cache overflow situation is likely to occur is illustrated in accordance with one approach. The method 650 may be performed in accordance with the present invention in any of the environments depicted in FIGS. 1-6C, among others, in various approaches. Of course, more or less operations than those specifically described in FIG. 6D may be included in method 650, as would be understood by one of skill in the art upon reading the present descriptions.

Each of the steps of the method 650 may be performed by any suitable component of the operating environment. For example, in various approaches, the method 650 may be partially or entirely performed by a controller, a processor, a computer, etc., or some other device having one or more processors therein. Thus, in some approaches, method 650 may be a computer-implemented method. In such approaches, the computer used to implement the method may include the tape drive itself or a portion thereof such as the controller, the tape, an external host, a server, etc. Moreover, the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 650. Illustrative processors include, but are not limited to, a central processing unit (CPU), an application specific integrated circuit (ASIC), a field programmable gate array (FPGA), etc., combinations thereof, or any other suitable computing device known in the art.

Figure 6D:
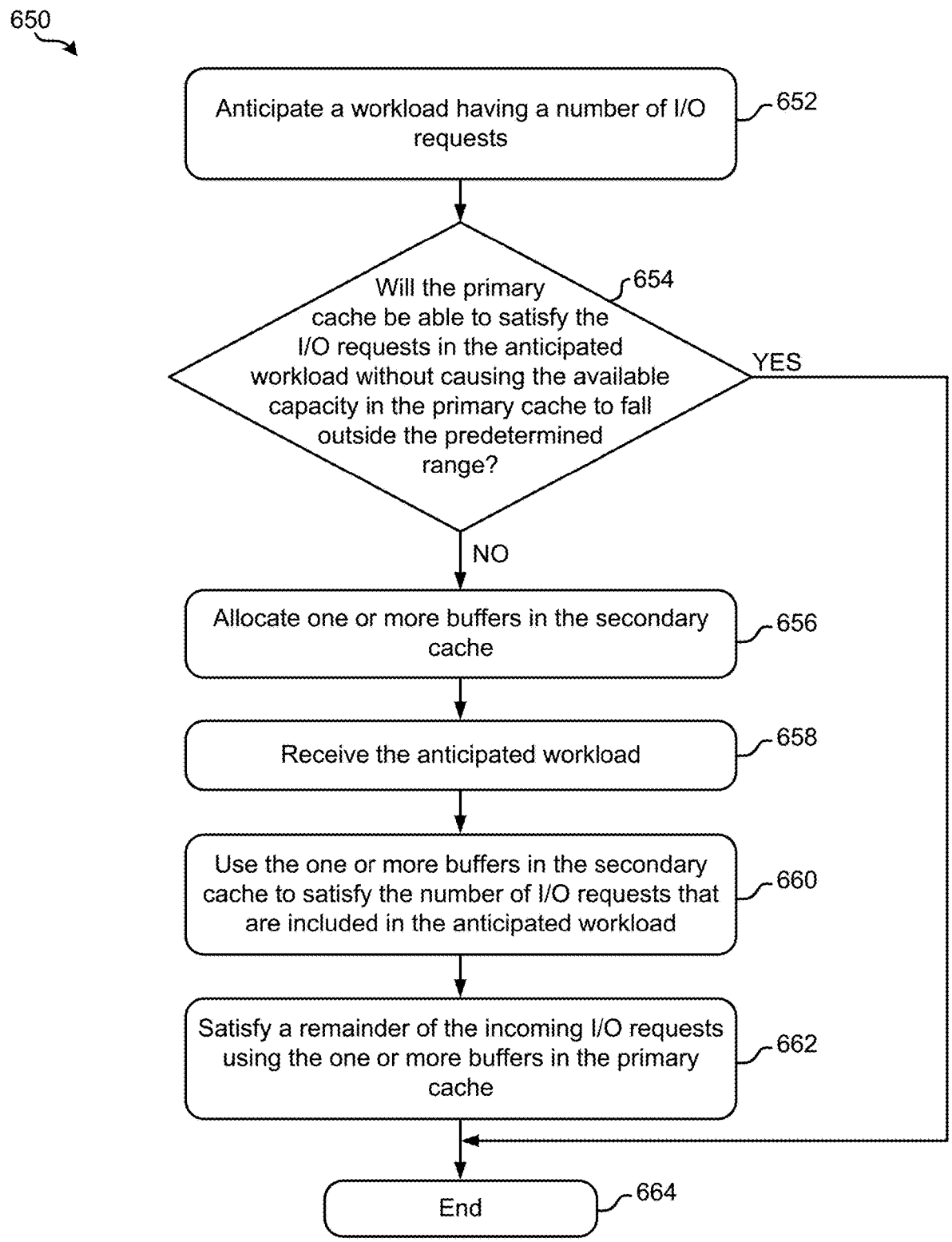
FIG. 6D is a flowchart of a method, in accordance with one approach.

As shown in FIG. 6D, operation 652 of method 650 includes anticipating a workload having a number of I/O requests. Depending on the situation, a workload may be anticipated in a number of different ways. For instance, certain workloads may be repeated at a specific time of day, on a particular day of the month or year, in response to certain weather conditions, etc., or in response to any other type of external criteria. This correlation between workloads and external criteria may thereby be used to anticipate an influx of I/O requests. In other situations, a preliminary indication may be received that a workload has been scheduled to be sent to the cache for implementation. This preliminary indication may thereby allow for the cache to take steps to ensure that the workload may be performed without experiencing a cache overflow or bottleneck situation.

It follows that by anticipating a workload of a particular size (e.g., having a certain number of I/O requests), the cache may be able to determine whether it will be able to satisfy the workload without experiencing a cache overflow or bottleneck situation as mentioned above. Decision 654 thereby includes determining whether the primary cache will be able to satisfy the number of I/O requests in the anticipated workload without causing the available capacity of the one or more buffers in the primary cache to fall outside the predetermined range. In other words, decision 654 includes determining whether the anticipated workload has a size that is greater than the available capacity of the primary cache.

This determination may be based on the currently available capacity of the primary cache in some instances, while in others the capacity of the primary cache is predicted for the time that the anticipated workload is to be received. In some approaches, the determination may be made by evaluating one or more current performance characteristics of the primary cache. For instance, the determination may be made by evaluating one or more of a number of the buffers in the primary cache that are in use, a turnover rate for the buffers in the primary cache, current I/O rates, the types of I/O requests that are in the one or more buffers in the primary cache, etc., or any other performance characteristics experienced by the primary cache. It should also be noted that any of the processes described above with respect to performing decision 608 and/or 616 may be implemented in order to perform decision 654, e.g., as would be appreciated by one skilled in the art after reading the present description.

In response to determining that the primary cache will be able to satisfy the number of I/O requests in the anticipated workload without causing the available capacity of the one or more buffers in the primary cache to fall outside the predetermined range, the flowchart jumps directly to operation 664 whereby method 650 may end. However, it should be noted that although method 650 may end upon reaching operation 662, any one or more of the processes included in method 650 may be repeated in order to process additional anticipated workloads. In other words, any one or more of the processes included in method 650 may be repeated for subsequently anticipated workloads.

Returning to decision 654, in response to determining that the primary cache will not be able to satisfy the number of I/O requests in the anticipated workload without causing the available capacity of the one or more buffers in the primary cache to fall outside the predetermined range, method 650 proceeds to operation 656. There, operation 656 includes allocating one or more buffers in the secondary cache. As noted above, the number of buffers allocated in the secondary cache may depend on the number of I/O requests that have been received, the amount of available capacity that remains in the primary cache, the current I/O turnover rate, etc. Moreover, the one or more buffers may be allocated using any processes which would be apparent to one skilled in the art after reading the present description.

Proceeding to operation 658, the anticipated workload is eventually received. Again, a workload may be predicted to occur at some point in the future, and therefore any amount of time may pass before the predicted workload is actually received. However, in some approaches the prediction may ultimately be incorrect and the workload may not actually be received. Thus, after a predetermined amount of time has passed since a workload was predicted to have been received, a determination may be made that the prediction was incorrect. In such approaches, method 650 may simply release the one or more buffers that were allocated in the secondary cache to satisfy the anticipated workload before ending.

In response to actually receiving the anticipated workload in operation 658, method 650 proceeds to operation 660 which includes using the one or more buffers in the secondary cache to satisfy the number of I/O requests that are included in the anticipated workload. While it is preferred that each of the I/O requests which correspond to the anticipated workload are satisfied using the one or more buffers in the secondary cache, the actual number of the I/O requests that are satisfied by the secondary cache varies depending on the approach. For instance, in some approaches a majority of the I/O requests in the anticipated workload are satisfied using the one or more buffers in the secondary cache.

Again, this allows for the primary cache to focus on flushing accumulated I/O requests and increasing the available capacity of the primary cache. However, in other approaches a minority of the I/O requests in the anticipated workload may be satisfied using the buffers in the secondary cache while a majority are satisfied by buffers in the primary cache, e.g., in situations where the primary cache is sufficiently empty.

Proceeding to operation 662, a remainder of the incoming I/O requests are satisfied using the one or more buffers in the primary cache. Although it is preferred that the one or more buffers in the secondary cache are used to satisfy the I/O requests in the anticipated workload, additional I/O requests may be received simultaneously. Thus, the primary cache may be used to satisfy I/O requests that are received as a result of nominal operation, while the secondary cache is used to satisfy I/O requests which correspond to the anticipated workload.

Moreover, from operation 662, the flowchart proceeds to operation 664 whereby method 650 may end. As noted above, although method 650 may end upon reaching operation 662, any one or more of the processes included in method 650 may be repeated in order to process additional anticipated workloads. In other words, any one or more of the processes included in method 650 may be repeated for subsequently anticipated workloads.

Although not shown, method 650 may include performing another determination as to whether the available capacity of the one or more buffers in the primary cache is still outside the predetermined range. In other words, method 650 may continue to determine whether a sufficient amount of space remains in the primary cache, e.g., such that cache overflow situations continue to be avoided. In response to determining that the available capacity of the one or more buffers in the primary cache has fallen outside the predetermined range, method 650 may take action to ensure that additional I/O requests are diverted to the secondary cache rather than the primary cache.

However, it should be noted that in some approaches a controller may be able to select which tier in cache is to be used to perform a given I/O request, sometimes using information included in the I/O requests themselves. For instance, the I/O request may include a designated flag, portion of metadata, header information, etc. which designates whether a portion of cache having a relatively high performance should be used to satisfy the I/O request, or a portion of cache having a relatively low performance should be used. In such approaches, the received I/O request may also include supplemental information which pertains to an anticipated workload of the I/O request. In other words, the I/O request may include some information which pertains to the type of workload that can be expected during the process of satisfying the I/O request. This information provides valuable insight as to which of the tiers in cache will be able to most efficiently satisfy the I/O request, e.g., as will be further described below.

Depending on the approach, the supplemental information may indicate various types of information. For instance, in some approaches the supplemental information may indicate an anticipated write repetition on a record or track basis. In other words, the supplemental information may indicate how many write operations are anticipated to be performed by the I/O request on each record or track. In other approaches, the supplemental information may indicate whether read verification is expected. In other words, the supplemental information may indicate whether data is anticipated to be read after being written, e.g., for verification purposes. In still other approaches, the supplemental information may indicate write frequency, dataset priority in a host application, an amount of data being accessed by the I/O request, etc. The supplemental information may also be received in various forms depending on the approach. For instance, in some approaches the supplemental information may be appended to the I/O request as metadata, represented by one or more bits included in the I/O request itself, accessed in a central lookup table, etc.

It follows that the various processes described above with respect to FIGS. 6A-6D are desirably able to utilize a multi-tiered cache to improve the efficiency by which various I/O requests are satisfied. By moving data within a cache having both DRAM and SCM during normal operations, the benefits of each type of memory in the cache can be used together. For instance, the DRAM portion of the cache will have higher performance characteristics than the SCM portion of the cache, yet SCM is a form of non-volatile memory which is significantly less expensive than DRAM and which provides data access speeds which are significantly higher than those achievable by SSDs. Although SCM experiences higher latency than DRAM (e.g., a few microsecs for SCM compared to nanoseconds for DRAM), it performs much better than SSDs which can experience greater than 100 microsecs of latency. SCM cache can also be configured to have multiple tiers, each tier having different performance characteristics with respect to the other tiers in the SCM cache. For example, a higher class tier may have high write endurance and improved data performance capabilities, while a lower tier may have low write endurance and reduced data performance capabilities.

Although an I/O request may actually be deemed as "satisfied" in response to determining that the data in memory will no longer be accessed with respect to the I/O request which has been completed (e.g., also referred to as "track end access"), additional operations may be performed to update additional copies of data. For instance, some I/O requests involve updating data in memory. Thus, it may be desirable in some approaches to determine whether data was merely accessed (e.g., read, inspected, etc.) or actually modified (e.g., written, deleted, etc.).

Figure 6E:
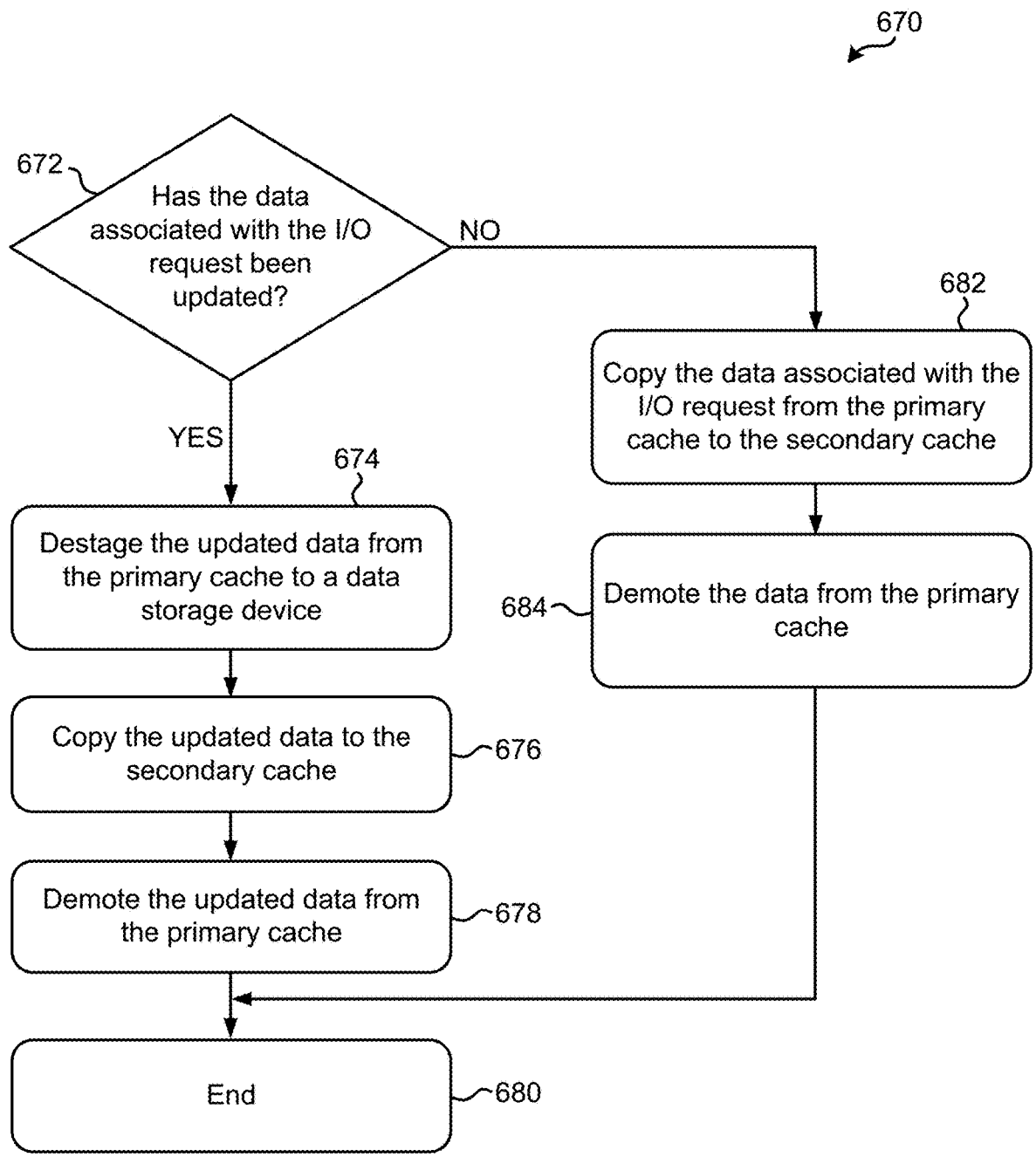
FIG. 6E is a flowchart of a method, in accordance with one approach.

Referring now to FIG. 6E, a method 670 for ensuring data that has been modified by the primary cache is destaged to data storage is illustrated in accordance with one approach. The method 670 may be performed in accordance with the present invention in any of the environments depicted in FIGS. 1-6D, among others, in various approaches. For example, any one or more of the processes described herein with respect to method 670 may be performed in response to the primary cache satisfying an I/O request (e.g., see 614 of FIG. 6A above). Of course, more or less operations than those specifically described in FIG. 6E may be included in method 670, as would be understood by one of skill in the art upon reading the present descriptions.

Each of the steps of the method 670 may be performed by any suitable component of the operating environment. For example, in various approaches, the method 670 may be partially or entirely performed by a controller, a processor, a computer, etc., or some other device having one or more processors therein. Thus, in some approaches, method 670 may be a computer-implemented method. In such approaches, the computer used to implement the method may include the tape drive itself or a portion thereof such as the controller, the tape, an external host, a server, etc. Moreover, the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 670. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6E, decision 672 of method 670 includes determining whether data associated with the I/O request has been updated as a result of the primary cache satisfying the I/O request. As noted above, some I/O requests may simply involve accessing (e.g., reading, inspecting, etc.) data stored in memory, and may therefore not actually modify any of the data. However, other I/O requests may actually modify (e.g., write, delete, append, etc.) data in memory.

In response to determining that the data associated with the I/O request has been updated as a result of the primary cache satisfying the I/O request, method 670 proceeds to operation 674. There, operation 674 includes destaging the updated data from the primary cache to a data storage device. In other words, operation 674 includes actually writing the updated data from the primary cache to the data storage device itself. The data storage device preferably includes a greater storage capacity than the primary and/or secondary caches and serves as a storage option for data that is received and processed by the caches. It follows that the data storage device may be used to store and provide continued access to relatively colder data that has been flushed out of the caches.

The data storage device is local with respect to the primary and secondary caches in some approaches (e.g., see 506 of FIG. 5 above), while in other approaches the data storage device may actually be remote (e.g., see 508 of FIG. 5 above). According to an illustrative approach, the data storage device may be a cloud object storage implemented as a part of a cloud computing environment. Thus, the process of destaging the updated data from the primary cache to a data storage device may vary in terms of how and/or where the updated data is transferred thereto, e.g., as would be appreciated by one skilled in the art after reading the present description.

From operation 674, method 670 proceeds to operation 676 which includes copying the updated data to the secondary cache. In addition to destaging the updated data from the primary cache to a data storage device, it is preferred that the updated data remains in cache at least temporarily following completion of the I/O request. As a result, any subsequent I/O requests involving the same data may be satisfied without having to query the data storage device, thereby improving efficiency and reducing data access times.

Operation 678 further includes demoting the updated data from the primary cache. This desirably frees space in the primary cache which may be utilized to perform additional I/O requests, while also keeping the updated data in the secondary portion of the cache. Should additional I/O requests be received which correspond to the updated data while it is still located in the secondary cache, the secondary cache and/or primary cache may satisfy the I/O requests more quickly and efficiently than if the updated data only been destaged to the data storage device.

From operation 678, the flowchart proceeds to operation 680 whereby method 670 may end. However, it should be noted that although method 670 may end upon reaching operation 680, any one or more of the processes included in method 670 may be repeated in order to satisfy additional I/O requests. In other words, any one or more of the processes included in method 670 may be repeated in order to process and satisfy subsequently received I/O requests.

However, returning momentarily to decision 672, it should be noted that method 670 proceeds to operation 682 in response to determining that the data associated with the I/O request has not been updated as a result of the primary cache satisfying the I/O request. According to an example, data associated with (e.g., specified in) a read request would not be updated as a result of performing the read request. It is likely that a copy of the data associated with the read request is already stored in the data storage device, thereby obviating the process of destaging the data to the data storage device. Accordingly, operation 682 includes copying the data associated with the I/O request from the primary cache to the secondary cache, while operation 684 includes demoting the data associated with the I/O request from the primary cache. From operation 684, the flowchart proceeds to operation 680 whereby method 670 may end, e.g., as described above.

However, it should be noted that an optional determination may be made as to whether a copy of the data associated with the I/O request is already stored in the data storage device. In response to determining that the data associated with the I/O request is not already stored in the data storage device, it may be destaged from the primary cache to the data storage device. It should also be noted that any one or more of the approaches described above with respect to performing operations 676 and/or 678 may be implemented in order to perform operations 682 and/or 684, respectively.

Figure 6F:
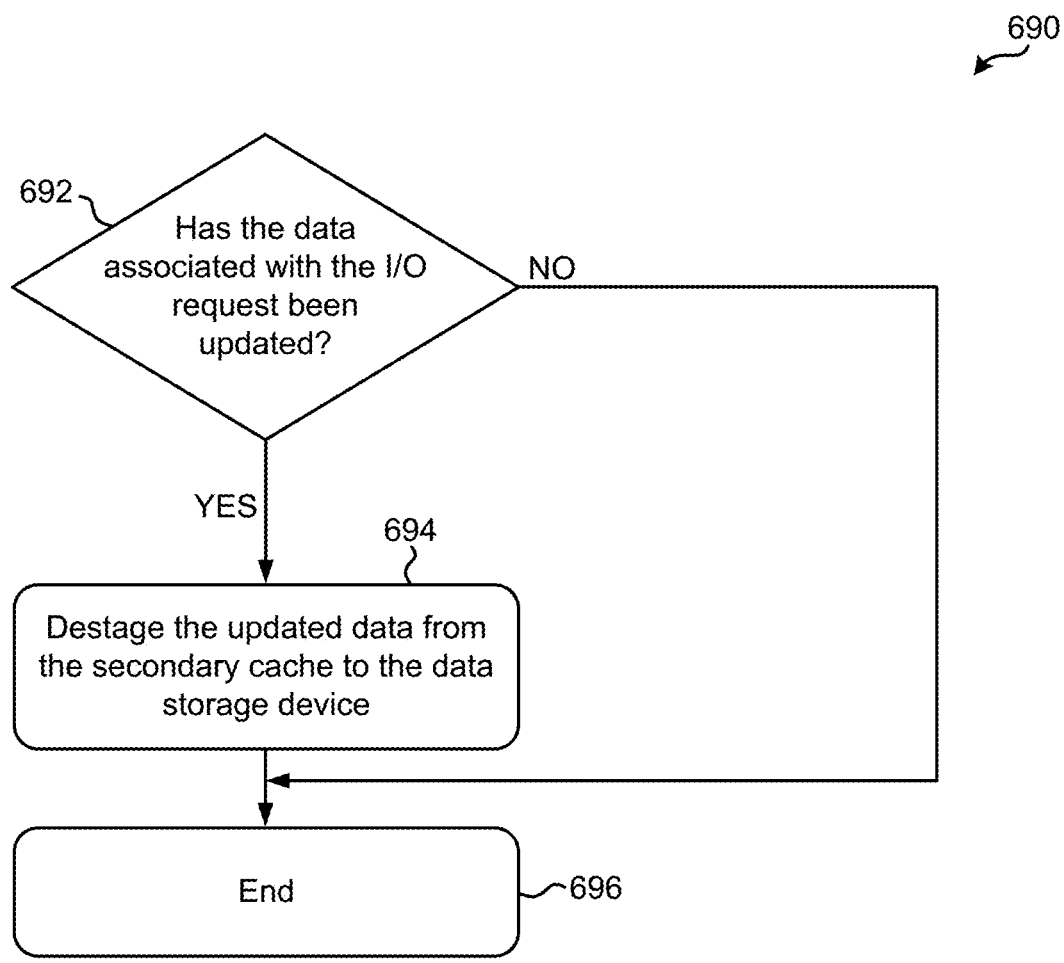
FIG. 6F is a flowchart of a method, in accordance with one approach.

It follows that the various processes included in method 670 are desirably able to ensure that I/O requests satisfied by the primary cache are accurately represented in storage. However, I/O requests are also satisfied using the secondary cache (e.g., see 612 of FIG. 6A). Accordingly, FIG. 6F depicts a method 690 for ensuring data that has been modified by the secondary cache is destaged to data storage in accordance with one approach. The method 690 may be performed in accordance with the present invention in any of the environments depicted in FIGS. 1-6D, among others, in various approaches. For example, any one or more of the processes described herein with respect to method 690 may be performed in response to the secondary cache satisfying an I/O request. Of course, more or less operations than those specifically described in FIG. 6F may be included in method 690, as would be understood by one of skill in the art upon reading the present descriptions.

Each of the steps of the method 690 may be performed by any suitable component of the operating environment. For example, in various approaches, the method 690 may be partially or entirely performed by a controller, a processor, a computer, etc., or some other device having one or more processors therein. Thus, in some approaches, method 690 may be a computer-implemented method. In such approaches, the computer used to implement the method may include the tape drive itself or a portion thereof such as the controller, the tape, an external host, a server, etc. Moreover, the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 690. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6F, decision 692 of method 690 includes determining whether data associated with the I/O request has been updated as a result of the secondary cache satisfying the I/O request. In response to determining that the data associated with the I/O request has been updated as a result of satisfying the I/O request, method 690 proceeds to operation 694. There, operation 694 includes destaging the updated data from the secondary cache to the data storage device. Operation 694 thereby ensures that a copy of the updated data associated with the I/O request remains in the secondary cache in addition to being stored in the data storage device, thereby improving data accessibility as well as data retention.

From operation 694, the flowchart proceeds to operation 696, whereby method 690 may end. However, it should be noted that although method 690 may end upon reaching operation 696, any one or more of the processes included in method 690 may be repeated in order to satisfy additional I/O requests. In other words, any one or more of the processes included in method 690 may be repeated in order to process and satisfy subsequently received I/O requests.

Returning to decision 692, method 690 proceeds directly to operation 696 in response to determining that the data associated with the I/O request has not been updated as a result of the secondary cache satisfying the I/O request. In other words, the data associated with the I/O request is simply maintained in the secondary cache.

As previously mentioned, an I/O request may be satisfied differently depending on the type of I/O request that is received. For example, a data read request may be satisfied by returning a copy of the requested data, while a data write request may be satisfied by actually writing data to memory. However, sometimes I/O requests are sent to the wrong target location, are corrupted in-transit, correspond to data stored in a remote storage location, etc., depending on the situation. In these situations, it is desirable that the I/O requests are failed. A determination as to whether a received I/O request was delivered to the correct target location may be performed prior to actually failing the I/O request. Moreover, a notification may be returned to the source of the I/O request indicating that the request has been failed.

It follows that various ones of the approaches described herein are able to significantly improve the process of satisfying I/O requests that are received. Again, data can be recalled directly from a data storage device (e.g., such as cloud object storage implemented as a part of a cloud computing environment) into cache. Some recalled data may not actually be used for some time, thereby causing the cache to become polluted until the recalled data is actually used or aged out if left unchecked. However, some of the approaches included herein are able to selectively utilize different portions of a cache for certain I/O requests. The basis of the data recall operations themselves are used to distinguish between them and decide if the recalled data should be stored in primary cache or secondary cache. While the primary cache preferably has higher performance characteristics than the secondary cache, the secondary cache preferably has a greater storage capacity, and is more resistant to wear caused by performing writing operations. It follows that the primary cache may be utilized to perform certain data operations (e.g., which involve high-priority and/or hot data), while the secondary cache is used as a default for the remaining data operations and to store data that has not yet been flushed out of cache.

Again, factors which may be considered in order to avoid cache overflow and/or bottleneck situations include the bind cache segments that are in use, bind cache segments that are available, bind cache segments that are in use for a specific application or data protocol, the speed at which the I/O requests are satisfied, etc. Moreover, once a threshold has been hit, action is taken to transfer at least some I/O requests to a secondary cache rather than the primary cache. For example, write pacing may be implemented in view of memory limitations, as well as in an effort to limit the recover point objective (RPO). Moreover, once a sufficient number of I/O requests have been flushed from the primary cache, incoming I/O requests may be routed to the primary cache again rather than the secondary cache.

From a broader context, there are a variety of I/O processing processes that are dependent on the usage of temporary memory (e.g., data buffers, task control blocks (TCBs), bind cache segments, etc.) for a period of time in order to successfully complete the I/O request. For instance, when large amounts of parameters are passed for certain commands such as queries, establishing and managing copy service relationships, or creating writesets, these parameters are stored within the control unit in data transfer buffers. These buffers are also used for the responses built for queries or even for count fields for read count commands.

These data transfer buffers are allocated out of hidden memory when the control unit is initiated, however there are a limited number of buffers that are available. Once these buffers are in use by the I/O requests that are currently active, new I/O requests are forced to wait. This delay may result in a logical disconnect or even a physical disconnect if the duration of the wait is significant enough. The delay itself may be significant and additional time outside of the delay itself grows coupled with the impact of a disconnect and subsequent reconnect both within the control and the host.

Similarly, scratch TCBs may also be used depending on the size of the data to be transferred. TCBs themselves are used to control each I/O request and contain the control structures used for the processing for multiple components. The resources are allocated out of memory when the control unit is initiated, but there are some limitations that can be allocated up because any memory not consumed is used for customer tracks stored in cache.

For example, in order to absorb high I/O demand on the internal DRAM storage memory, SCM can be leveraged as a repository for the increased buffer requirements. As the resources are consumed in DRAM, additional buffers (whether for data transfer, TCBs, bind segment users, etc.) can be allocated and distributed from SCM instead of DRAM. This allows the control unit to keep up with the memory demands, while also being able to process the I/O requests without the impact of a resource wait and disconnect/reconnect overhead.

For instance, as more resources are consumed in DRAM, I/O requests with lower performance characteristics may be anticipated and satisfied using SCM, while DRAM is reserved for higher performance I/O requests. Moreover, I/O requests can be prioritized based on priority parameters or by the type of I/O request itself. According to an example, which is in no way intended to limit the invention, FC Extended Link Services or Name Server Management commands have different requirements for response time than Open or CKD Host Read/Write commands, e.g., as would be appreciated by one skilled in the art after reading the present description.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 7:
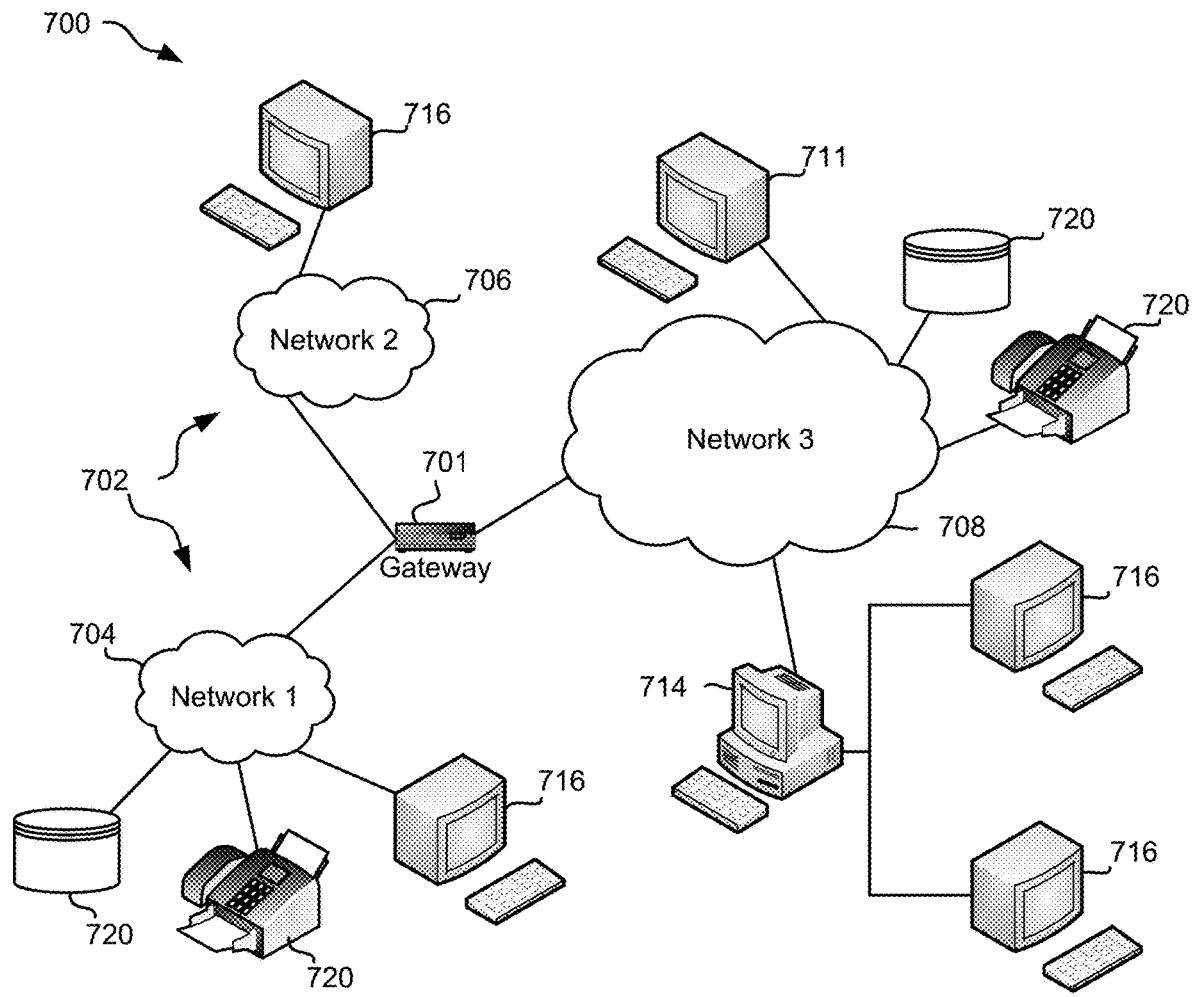
FIG. 7 is a network architecture, in accordance with one approach.

FIG. 7 illustrates a network architecture 700, in accordance with one approach. As shown in FIG. 7, a plurality of remote networks 702 are provided including a first remote network 704 and a second remote network 706. A gateway 701 may be coupled between the remote networks 702 and a proximate network 708. In the context of the present network architecture 700, the networks 704, 706 may each take any form including, but not limited to a LAN, a WAN such as the Internet, public switched telephone network (PSTN), internal telephone network, etc.

In use, the gateway 701 serves as an entrance point from the remote networks 702 to the proximate network 708. As such, the gateway 701 may function as a router, which is capable of directing a given packet of data that arrives at the gateway 701, and a switch, which furnishes the actual path in and out of the gateway 701 for a given packet.

Further included is at least one data server 714 coupled to the proximate network 708, and which is accessible from the remote networks 702 via the gateway 701. It should be noted that the data server(s) 714 may include any type of computing device/groupware. Coupled to each data server 714 is a plurality of user devices 716. Such user devices 716 may include a desktop computer, laptop computer, handheld computer, printer, and/or any other type of logic-containing device. It should be noted that a user device 711 may also be directly coupled to any of the networks, in some approaches.

A peripheral 720 or series of peripherals 720, e.g., facsimile machines, printers, scanners, hard disk drives, networked and/or local data storage units or systems, etc., may be coupled to one or more of the networks 704, 706, 708. It should be noted that databases and/or additional components may be utilized with, or integrated into, any type of network element coupled to the networks 704, 706, 708. In the context of the present description, a network element may refer to any component of a network.

According to some approaches, methods and systems described herein may be implemented with and/or on virtual systems and/or systems which emulate one or more other systems, such as a UNIX® system which virtually hosts a Microsoft® Windows® environment, etc. This virtualization and/or emulation may be enhanced through the use of VMware® software, in some approaches.

In other approaches, one or more networks 704, 706, 708, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 8:
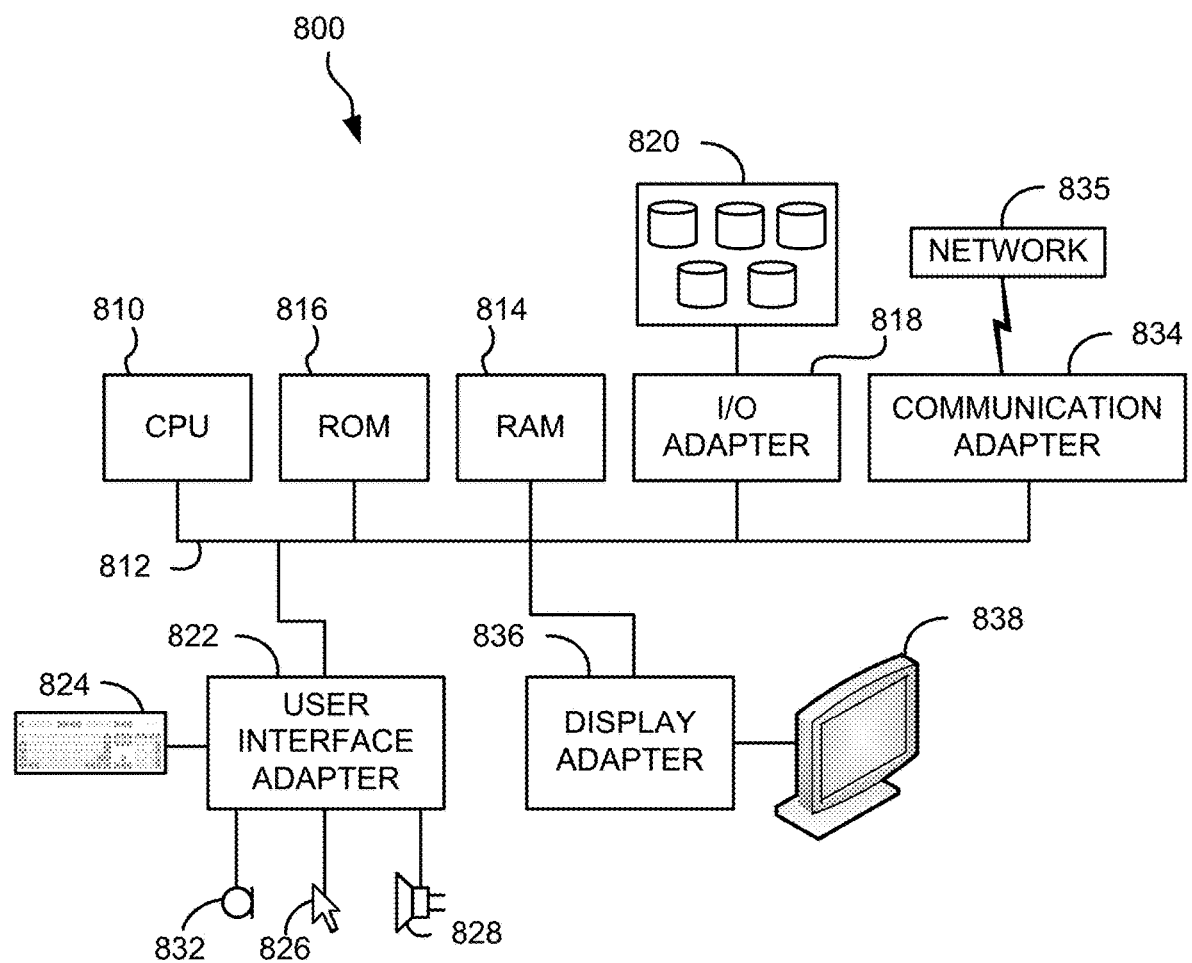
FIG. 8 is a representative hardware environment that may be associated with the servers and/or clients of FIG. 7, in accordance with one approach.

FIG. 8 shows a representative hardware environment associated with a user device 716 and/or server 714 of FIG. 7, in accordance with one approach. FIG. 8 illustrates a typical hardware configuration of a processor system 800 having a central processing unit 810, such as a microprocessor, and a number of other units interconnected via a system bus 812, according to one approach. In some approaches, central processing unit 810 may include any of the approaches described above with reference to the one or more processors 210 of FIG. 2.

The processor system 800 shown in FIG. 8 includes a Random Access Memory (RAM) 814, Read Only Memory (ROM) 816, and an I/O adapter 818. According to some approaches, which are in no way intended to limit the invention, I/O adapter 818 may include any of the approaches described above with reference to I/O adapter 218 of FIG. 2. Referring still to processor system 800 of FIG. 8, the aforementioned components 814, 816, 818 may be used for connecting peripheral devices such as storage subsystem 820 to the bus 812. In some approaches, storage subsystem 820 may include a similar and/or the same configuration as data storage system 220 of FIG. 2. According to an example, which is in no way intended to limit the invention, storage subsystem 820 may include non-volatile data storage cards, e.g., having NVRAM memory cards, RAM, ROM, and/or some other known type of non-volatile memory, in addition to RAID controllers as illustrated in FIG. 2.

With continued reference to FIG. 8, a user interface adapter 822 for connecting a keyboard 824, a mouse 826, a speaker 828, a microphone 832, and/or other user interface devices such as a touch screen, a digital camera (not shown), etc., to the bus 812.

Processor system 800 further includes a communication adapter 834 which connects the processor system 800 to a communication network 835 (e.g., a data processing network) and a display adapter 836 which connects the bus 812 to a display device 838.

The processor system 800 may have resident thereon an operating system such as the Microsoft® Windows® Operating System (OS), a macOS®, a UNIX® OS, etc. It will be appreciated that a preferred approach may also be implemented on platforms and operating systems other than those mentioned. A preferred approach may be written using Java®, XML, C, and/or C++ language, or other programming languages, along with an object oriented programming methodology. Object oriented programming (OOP), which has become increasingly used to develop complex applications, may be used.

Figure 9:
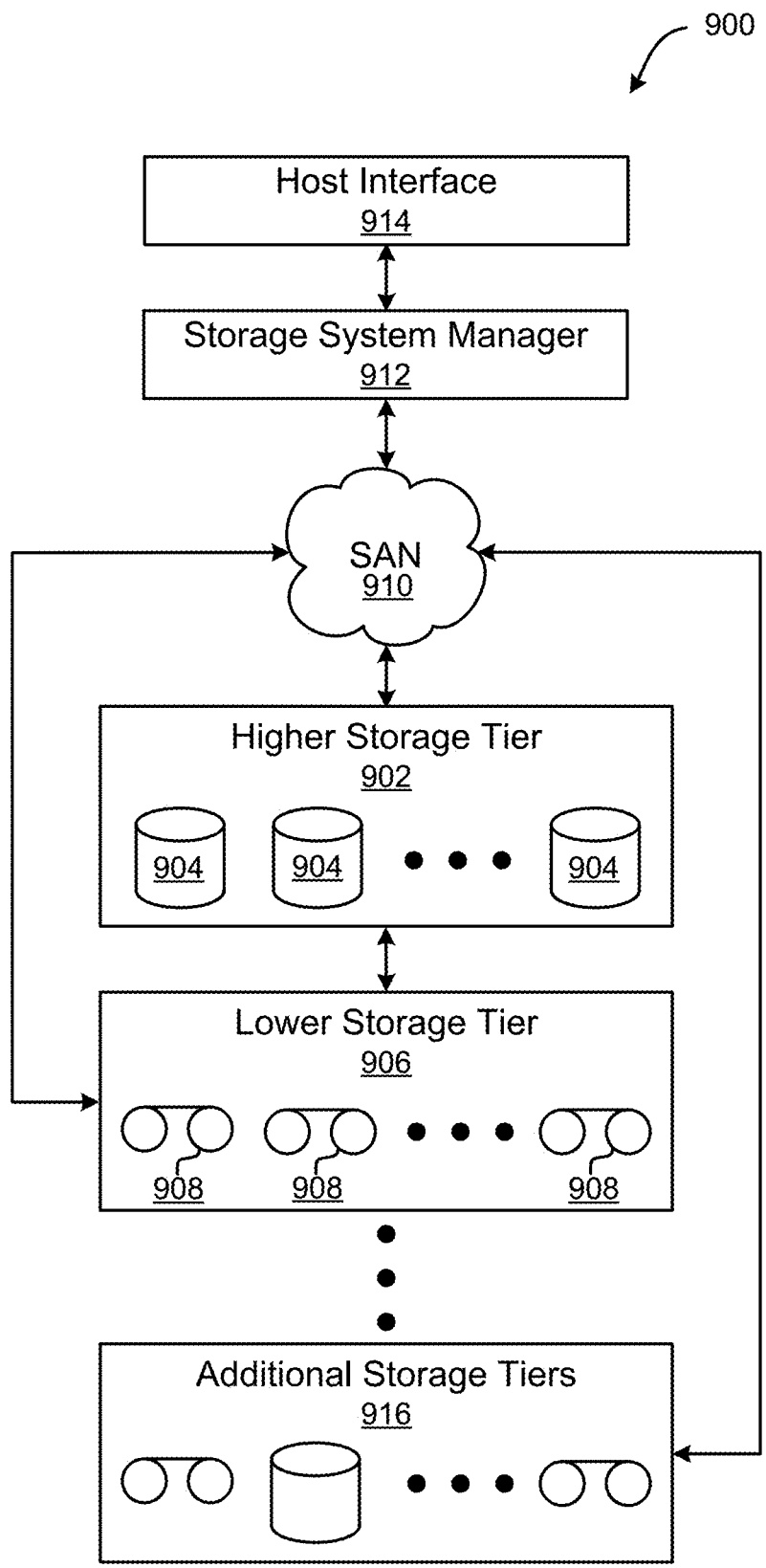
FIG. 9 is a diagram of a tiered data storage system in accordance with one approach.

Moreover, FIG. 9 illustrates a storage system 900 which implements high level (e.g., SSD) storage tiers in combination with lower level (e.g., magnetic tape) storage tiers, according to one approach. Note that some of the elements shown in FIG. 9 may be implemented as hardware and/or software, according to various approaches. The storage system 900 may include a storage system manager 912 for communicating with a plurality of media on at least one higher storage tier 902 and at least one lower storage tier 906. However, in other approaches, a storage system manager 912 may communicate with a plurality of media on at least one higher storage tier 902, but no lower storage tier. The higher storage tier(s) 902 preferably may include one or more random access and/or direct access media 904, such as hard disks, nonvolatile memory (NVM), NVRAM), solid state memory in SSDs, flash memory, SSD arrays, flash memory arrays, etc., and/or others noted herein or known in the art. According to illustrative examples, FIGS. 3-4 show exemplary architectures of SSD systems which may be used as a higher storage tier 902 depending on the desired approach.

Referring still to FIG. 9, the lower storage tier(s) 906 preferably includes one or more lower performing storage media 908, including sequential access media such as magnetic tape in tape drives and/or optical media, slower accessing HDDs, slower accessing SSDs, etc., and/or others noted herein or known in the art. One or more additional storage tiers 916 may include any combination of storage memory media as desired by a designer of the system 900. Thus, the one or more additional storage tiers 916 may, in some approaches, include an SSD system architecture similar or the same as those illustrated in FIGS. 1-2. Also, any of the higher storage tiers 902 and/or the lower storage tiers 906 may include any combination of storage devices and/or storage media.

The storage system manager 912 may communicate with the storage media 904, 908 on the higher storage tier(s) 902 and lower storage tier(s) 906 through a network 910, such as a storage area network (SAN), as shown in FIG. 9, or some other suitable network type. The storage system manager 912 may also communicate with one or more host systems (not shown) through a host interface 914, which may or may not be a part of the storage system manager 912. The storage system manager 912 and/or any other component of the storage system 900 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more approaches, the storage system 900 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 902, may include a majority of SSD storage media for storing data in a higher performing storage environment, and remaining storage tiers, including lower storage tier 906 and additional storage tiers 916 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 902, while data not having one of these attributes may be stored to the additional storage tiers 916, including lower storage tier 906. Of course, one of skill in the art, upon reading the present descriptions, may devise many other combinations of storage media types to implement into different storage schemes, according to the approaches presented herein.

According to some approaches, the storage system (such as 900) may include logic configured to receive a request to open a data set, logic configured to determine if the requested data set is stored to a lower storage tier 906 of a tiered data storage system 900 in multiple associated portions, logic configured to move each associated portion of the requested data set to a higher storage tier 902 of the tiered data storage system 900, and logic configured to assemble the requested data set on the higher storage tier 902 of the tiered data storage system 900 from the associated portions.

Of course, this logic may be implemented as a method on any device and/or system or as a computer program product, according to various approaches.

For instance, the remote data storage location 508 of FIG. 5 may be cloud object storage implemented as a part of a cloud computing environment, e.g., as noted above. However, it is to be understood that although this disclosure includes a detailed description on cloud computing, implementation of the teachings recited herein are not limited to a cloud computing environment. Rather, approaches of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 10:
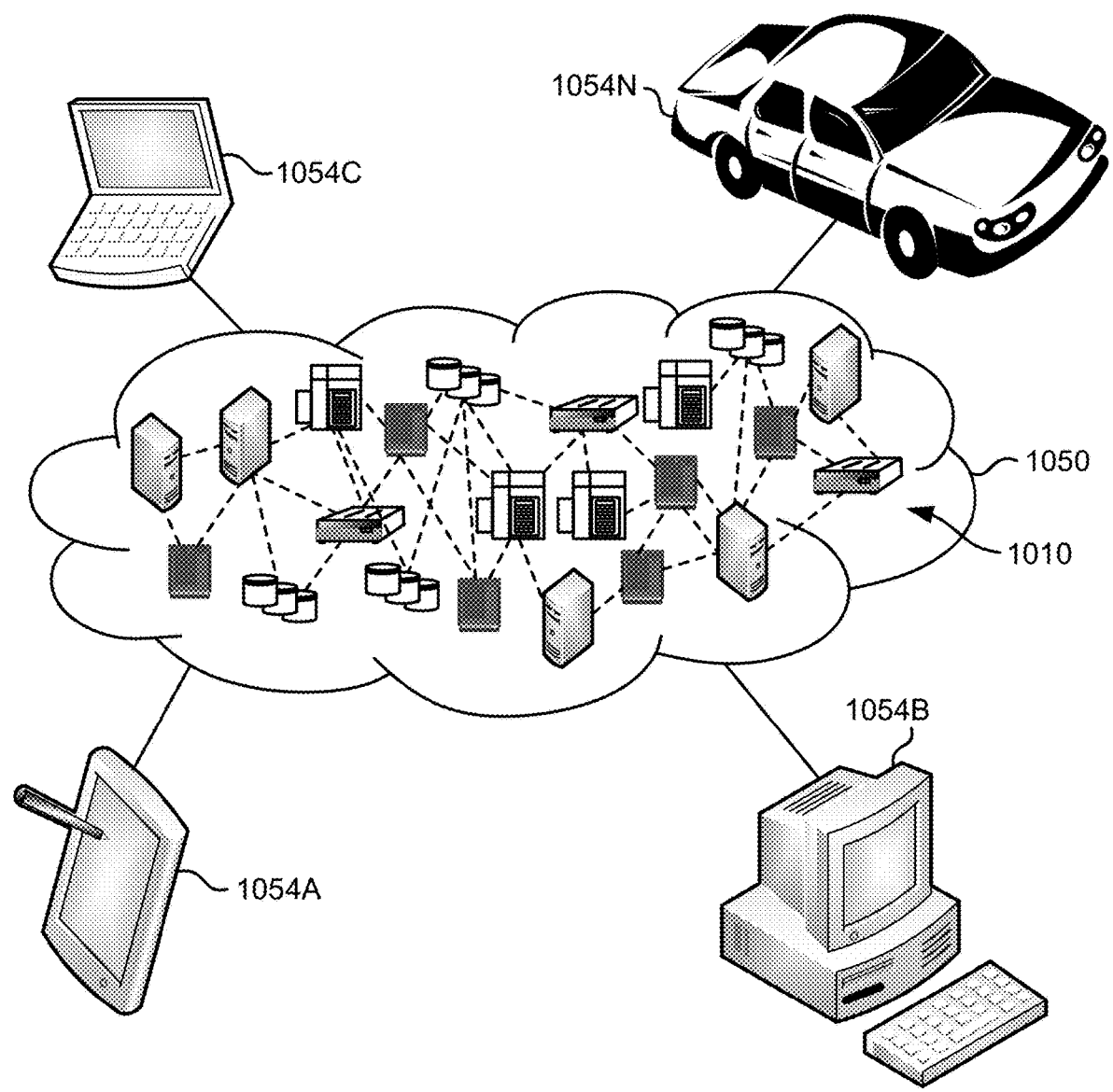
FIG. 10 depicts a cloud computing environment in accordance with one approach.

Referring now to FIG. 10, illustrative cloud computing environment 1050 is depicted. As shown, cloud computing environment 1050 includes one or more cloud computing nodes 1010 with which local computing devices used by cloud consumers, such as, for example, personal digital assistant (PDA) or cellular telephone 1054A, desktop computer 1054B, laptop computer 1054C, and/or automobile computer system 1054N may communicate. Nodes 1010 may communicate with one another. They may be grouped (not shown) physically or virtually, in one or more networks, such as Private, Community, Public, or Hybrid clouds as described hereinabove, or a combination thereof. This allows cloud computing environment 1050 to offer infrastructure, platforms and/or software as services for which a cloud consumer does not need to maintain resources on a local computing device. It is understood that the types of computing devices 1054A-1054N shown in FIG. 10 are intended to be illustrative only and that computing nodes 1010 and cloud computing environment 1050 can communicate with any type of computerized device over any type of network and/or network addressable connection (e.g., using a web browser).

Figure 11:
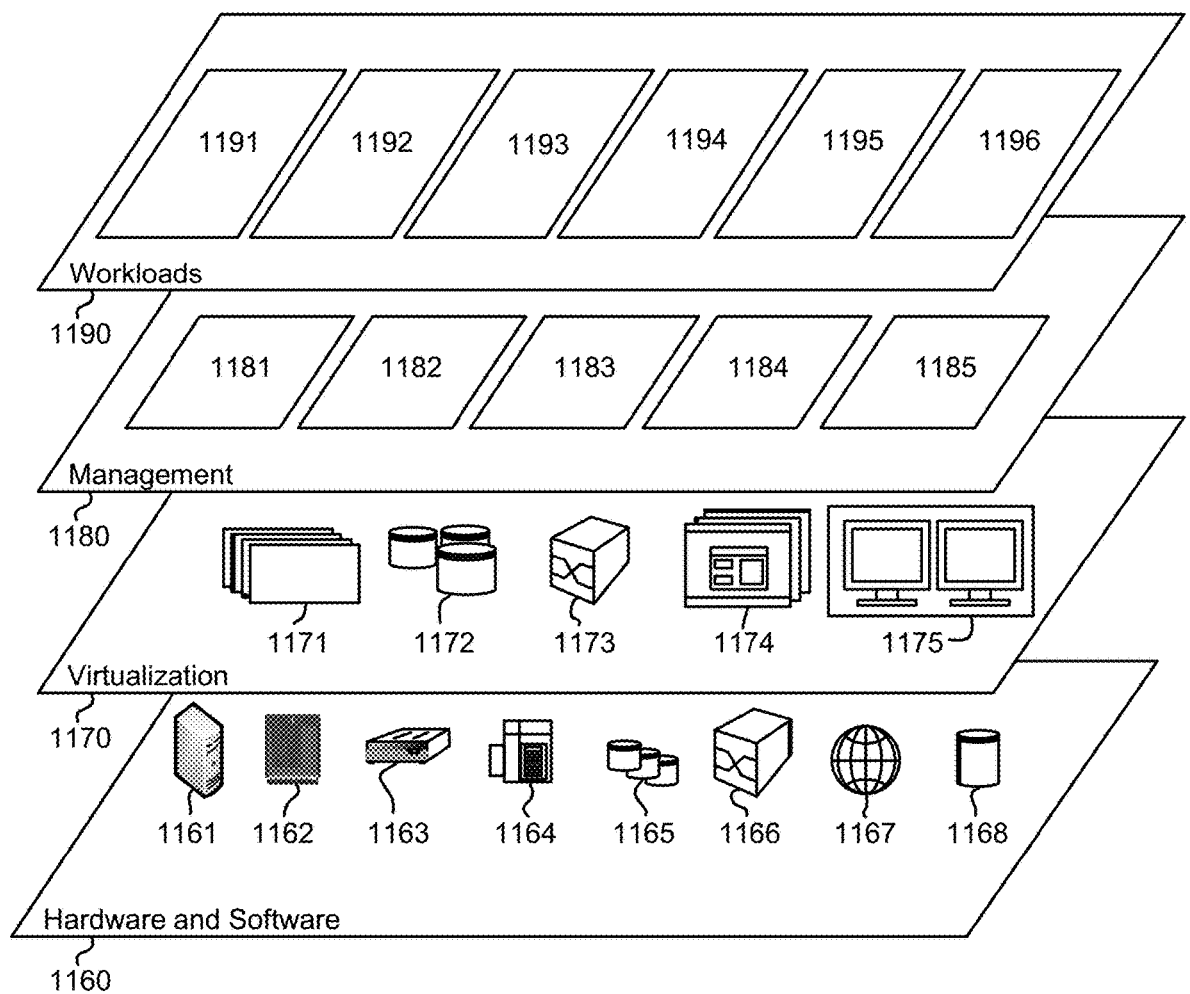
FIG. 11 depicts abstraction model layers in accordance with one approach.

Referring now to FIG. 11, a set of functional abstraction layers provided by cloud computing environment 1050 (FIG. 10) is shown. It should be understood in advance that the components, layers, and functions shown in FIG. 11 are intended to be illustrative only and approaches of the invention are not limited thereto. As depicted, the following layers and corresponding functions are provided:

Hardware and software layer 1160 includes hardware and software components. Examples of hardware components include: mainframes 1161; RISC (Reduced Instruction Set Computer) architecture based servers 1162; servers 1163; blade servers 1164; storage devices 1165; and networks and networking components 1166. In some approaches, software components include network application server software 1167 and database software 1168.

Virtualization layer 1170 provides an abstraction layer from which the following examples of virtual entities may be provided: virtual servers 1171; virtual storage 1172; virtual networks 1173, including virtual private networks; virtual applications and operating systems 1174; and virtual clients 1175.

In one example, management layer 1180 may provide the functions described below. Resource provisioning 1181 provides dynamic procurement of computing resources and other resources that are utilized to perform tasks within the cloud computing environment. Metering and Pricing 1182 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1183 provides access to the cloud computing environment for consumers and system administrators. Service level management 1184 provides cloud computing resource allocation and management such that required service levels are met. Service Level Agreement (SLA) planning and fulfillment 1185 provide pre-arrangement for, and procurement of, cloud computing resources for which a future requirement is anticipated in accordance with an SLA.

Workloads layer 1190 provides examples of functionality for which the cloud computing environment may be utilized. Examples of workloads and functions which may be provided from this layer include: mapping and navigation 1191; software development and lifecycle management 1192; virtual classroom education delivery 1193; data analytics processing 1194; transaction processing 1195; and using multi-tiered cache to satisfy received I/O requests 1196, e.g., according to any of the approaches included herein.

What is claimed is:

1. A computer-implemented method, comprising:
monitoring an available capacity of one or more buffers in a primary cache, wherein the primary cache is coupled to a secondary cache and a data storage device;
receiving a stream of incoming input/output (I/O) requests;
in response to determining that the available capacity of the one or more buffers in the primary cache is not outside a predetermined range:
using the one or more buffers in the primary cache to satisfy all of the incoming I/O requests;
in response to determining that the available capacity of the one or more buffers in the primary cache is outside the predetermined range:
allocating one or more buffers in the secondary cache,
using the one or more buffers in the secondary cache to satisfy at least some of the incoming I/O requests, and
using the one or more buffers in the primary cache to satisfy a remainder of the incoming I/O requests; and.

2. The computer-implemented method of claim 1, wherein the primary cache includes dynamic random access memory.

3. The computer-implemented method of claim 1, comprising:
in response to determining that the available capacity of the one or more buffers in the primary cache is not outside the predetermined range:
transferring any remaining I/O requests in the one or more buffers in the secondary cache to the one or more buffers in the primary cache; and
releasing the one or more buffers in the secondary cache.

4. The computer-implemented method of claim 1, comprising:
in response to determining that the available capacity of the one or more buffers in the primary cache is not outside the predetermined range:
using the secondary cache to satisfy any remaining I/O requests in the one or more buffers in the secondary cache; and
releasing the one or more buffers in the secondary cache.

5. The computer-implemented method of claim 1, comprising:
anticipating a workload having a number of I/O requests;
determining whether the primary cache will be able to satisfy the number of I/O requests in the anticipated workload without causing the available capacity of the one or more buffers in the primary cache to fall outside the predetermined range;
in response to determining that the primary cache will not be able to satisfy the number of I/O requests in the anticipated workload without causing the available capacity of the one or more buffers in the primary cache to fall outside the predetermined range, allocating one or more buffers in the secondary cache;
using the one or more buffers in the secondary cache to satisfy the number of I/O requests in the anticipated workload; and
using the one or more buffers in the primary cache to satisfy a remainder of the incoming I/O requests.

6. The computer-implemented method of claim 5, wherein determining whether the primary cache will be able to satisfy the number of I/O requests in the anticipated workload without causing the available capacity of the one or more buffers in the primary cache to fall outside the predetermined range includes:
evaluating one or more performance characteristics of the primary cache,
wherein the one or more performance characteristics are selected from the group consisting of: a number of the buffers in the primary cache that are in use, a turnover rate for the buffers in the primary cache, current I/O rates, and the types of I/O requests that are in the one or more buffers in the primary cache.

7. The computer-implemented method of claim 1, wherein the secondary cache includes a first tier of storage class memory and a second tier of storage class memory, wherein performance characteristics of the first tier of storage class memory are greater than performance characteristics of the second tier of storage class memory.

8. The computer-implemented method of claim 7, wherein the primary cache includes dynamic random access memory.

9. A computer program product comprising a computer readable storage medium having program instructions embodied therewith, the program instructions readable and/or executable by a processor to cause the processor to:
receive, by the processor, a stream of incoming input/output (I/O) requests;
use, by the processor, one or more buffers in a primary cache to satisfy all of the incoming I/O requests, wherein the primary cache is coupled to a secondary cache and a data storage device;
monitor, by the processor, an available capacity of the one or more buffers in the primary cache;
in response to determining that the available capacity of the one or more buffers in the primary cache is outside a predetermined range:
allocate, by the processor, one or more buffers in the secondary cache,
use, by the processor, the one or more buffers in the secondary cache to satisfy at least some of the incoming I/O requests, and
use, by the processor, the one or more buffers in the primary cache to satisfy a remainder of the incoming I/O requests; and
in response to determining that the available capacity of the one or more buffers in the primary cache is not outside the predetermined range:
use, by the processor, the one or more buffers in the primary cache to satisfy all of the incoming I/O requests.

10. The computer program product of claim 9, wherein the primary cache includes dynamic random access memory.

11. The computer program product of claim 9, wherein the program instructions are readable and/or executable by the processor to cause the processor to:
in response to determining that the available capacity of the one or more buffers in the primary cache is not outside the predetermined range:
transfer, by the processor, any remaining I/O requests in the one or more buffers in the secondary cache to the one or more buffers in the primary cache; and
release, by the processor, the one or more buffers in the secondary cache.

12. The computer program product of claim 9, wherein the program instructions are readable and/or executable by the processor to cause the processor to:

in response to determining that the available capacity of the one or more buffers in the primary cache is not outside the predetermined range:
  use, by the processor, the secondary cache to satisfy any remaining I/O requests in the one or more buffers in the secondary cache; and
  release, by the processor, the one or more buffers in the secondary cache.

13. The computer program product of claim 9, wherein the program instructions are readable and/or executable by the processor to cause the processor to:
  anticipate, by the processor, a workload having a number of I/O requests;
  determine, by the processor, whether the primary cache will be able to satisfy the number of I/O requests in the anticipated workload without causing the available capacity of the one or more buffers in the primary cache to fall outside the predetermined range;
  in response to determining that the primary cache will not be able to satisfy the number of I/O requests in the anticipated workload without causing the available capacity of the one or more buffers in the primary cache to fall outside the predetermined range, allocate, by the processor, one or more buffers in the secondary cache;
  use, by the processor, the one or more buffers in the secondary cache to satisfy the number of I/O requests in the anticipated workload; and
  use, by the processor, the one or more buffers in the primary cache to satisfy a remainder of the incoming I/O requests.

14. The computer program product of claim 13, wherein determining whether the primary cache will be able to satisfy the number of I/O requests in the anticipated workload without causing the available capacity of the one or more buffers in the primary cache to fall outside the predetermined range includes:
  evaluating one or more performance characteristics of the primary cache,
  wherein the one or more performance characteristics are selected from the group consisting of: a number of the buffers in the primary cache that are in use, a turnover rate for the buffers in the primary cache, current I/O rates, and the types of I/O requests that are in the one or more buffers in the primary cache.

15. The computer program product of claim 9, wherein the secondary cache includes a first tier of storage class memory and a second tier of storage class memory, wherein performance characteristics of the first tier of storage class memory are greater than performance characteristics of the second tier of storage class memory.

16. The computer program product of claim 15, wherein the primary cache includes dynamic random access memory.

17. A system, comprising:
  a processor, wherein the processor is coupled to a primary cache and a secondary cache; and
  logic integrated with the processor, executable by the processor, or integrated with and executable by the processor, the logic being configured to:
    receive, by the processor, a stream of incoming input/output (I/O) requests;
    use, by the processor, one or more buffers in a primary cache to satisfy all of the incoming I/O requests, wherein the primary cache is coupled to a secondary cache and a data storage device;
    monitor, by the processor, an available capacity of the one or more buffers in the primary cache;
    in response to determining that the available capacity of the one or more buffers in the primary cache is outside a predetermined range:
      allocate, by the processor, one or more buffers in the secondary cache,
      use, by the processor, the one or more buffers in the secondary cache to satisfy at least some of the incoming I/O requests, and
      use, by the processor, the one or more buffers in the primary cache to satisfy a remainder of the incoming I/O requests;
    in response to determining that the available capacity of the one or more buffers in the primary cache is not outside the predetermined range:
      use, by the processor, the one or more buffers in the primary cache to satisfy all of the incoming I/O requests;
    anticipate, by the processor, a workload having a number of I/O requests; and
    determine, by the processor, whether the primary cache will be able to satisfy the number of I/O requests in the anticipated workload without causing the available capacity of the one or more buffers in the primary cache to fall outside the predetermined range by: evaluating one or more performance characteristics of the primary cache.

18. The system of claim 17, wherein the primary cache includes dynamic random access memory.

19. The system of claim 17, the logic being configured to:
  in response to determining that the available capacity of the one or more buffers in the primary cache is not outside the predetermined range:
    transfer, by the processor, any remaining I/O requests in the one or more buffers in the secondary cache to the one or more buffers in the primary cache; and
    release, by the processor, the one or more buffers in the secondary cache.

20. The system of claim 17, the logic being configured to:
  in response to determining that the available capacity of the one or more buffers in the primary cache is not outside the predetermined range:
    use, by the processor, the secondary cache to satisfy any remaining I/O requests in the one or more buffers in the secondary cache; and
    release, by the processor, the one or more buffers in the secondary cache.

21. The system of claim 17, the logic being configured to:
  in response to determining that the primary cache will not be able to satisfy the number of I/O requests in the anticipated workload without causing the available capacity of the one or more buffers in the primary cache to fall outside the predetermined range, allocate, by the processor, one or more buffers in the secondary cache;
  use, by the processor, the one or more buffers in the secondary cache to satisfy the number of I/O requests in the anticipated workload; and
  use, by the processor, the one or more buffers in the primary cache to satisfy a remainder of the incoming I/O requests.

22. The system of claim 21, wherein the one or more performance characteristics are selected from the group consisting of: a number of the buffers in the primary cache that are in use, a turnover rate for the buffers in the primary cache, current I/O rates, and the types of I/O requests that are in the one or more buffers in the primary cache.

23. The system of claim 17, wherein the secondary cache includes a first tier of storage class memory and a second tier of storage class memory, wherein performance characteristics of the first tier of storage class memory are greater than performance characteristics of the second tier of storage class memory.

24. The system of claim 23, wherein the primary cache includes dynamic random access memory.

* * * * *